United States Patent [19]
Suminaga et al.

[11] Patent Number: 5,812,440
[45] Date of Patent: Sep. 22, 1998

[54] SEMICONDUCTOR STORAGE DEVICE

[75] Inventors: Yasuo Suminaga, Mie-ken; Koji Komatsu, Nara, both of Japan

[73] Assignee: Sharp Kabushiki Kaisha, Osaka, Japan

[21] Appl. No.: 985,465

[22] Filed: Dec. 4, 1997

Related U.S. Application Data

[62] Division of Ser. No. 674,827, Jul. 2, 1996, Pat. No. 5,726,929.

[30] Foreign Application Priority Data

Mar. 22, 1996 [JP] Japan ................................. 8-066877

[51] Int. Cl.⁶ .............................. G11C 5/02; G11C 17/00
[52] U.S. Cl. ............................ 365/51; 365/63; 365/104; 365/230.03
[58] Field of Search ................................. 365/51, 104, 94, 365/230.03, 63

[56] References Cited

U.S. PATENT DOCUMENTS

| | | |
|---|---|---|
| 5,280,442 | 1/1994 | Hotta et al. .............................. 365/63 |
| 5,341,337 | 8/1994 | Hotta .................................. 365/104 X |
| 5,386,381 | 1/1995 | Takizawa et al. ..................... 365/104 |
| 5,467,300 | 11/1995 | Komarek et al. ....................... 365/94 |
| 5,506,813 | 4/1996 | Mochizuki et al. ............... 365/230.03 |
| 5,557,124 | 9/1996 | Roy et al. . |
| 5,615,163 | 3/1997 | Sakui et al. . |

FOREIGN PATENT DOCUMENTS

| | | |
|---|---|---|
| 3-142877 | 6/1991 | Japan . |
| 3-179775 | 8/1991 | Japan . |
| 4-311900 | 11/1992 | Japan . |
| 5-167042 | 7/1993 | Japan . |
| 6-104406 | 4/1994 | Japan . |
| 6-318683 | 11/1994 | Japan . |

Primary Examiner—Huan Hoang
Attorney, Agent, or Firm—Morrison & Foerster LLP

[57] ABSTRACT

In a semiconductor storage device, a potential corresponding to a position of a word line selected from the memory cell array is applied to a bank selection line which is connected to the gate of a bank selection transistor, as an ON potential for the bank selection transistor so that it is possible to reduce the variation in the bit line potential depending upon the position of a memory cell in a bank of a ROM using a bank system.

27 Claims, 24 Drawing Sheets

SEMICONDUCTOR STORAGE DEVICE

This application is a division of application Ser. No. 08/674,827, filed Jul. 2, 1996, now U.S. Pat. No. 5,726,929.

BACKGROUND OF THE INVENTION

1. Field of the Invention

The present invention relates to a semiconductor storage device. More particularly, the present invention relates to various configurations for a memory cell array in a read-only memory (ROM) using a bank system and a method for reading out data from such a memory.

2. Description of the Related Art

A bank system has conventionally been proposed for a read-only semiconductor storage device or a semiconductor ROM (see, for example, Japanese Laid-Open Patent Publication Nos. 3-179775, 3-142877 and 4-311900).

A conventional read-only memory device having a plurality of NOR type cells according to such a bank system includes: a plurality of memory cells which are arranged in matrix; and a plurality of word lines which are provided so as to correspond to the respective rows of the memory cells for selecting among the rows. The memory device further includes: a main bit line and a main ground line for reading out information from the selected memory cells; and a plurality of sub-bit lines and a plurality of sub-ground lines which are provided so as to correspond to the respective columns of the memory cells and connected to the corresponding memory cells. A bank selection transistor (hereinafter, simply referred to as a "bank Tr") for selecting a column of memory cells is connected between the main bit line and the sub-bit line and between the main ground line and the sub-ground line.

Each of the memory cells is formed so as to selectively have a high threshold voltage or a low threshold voltage in accordance with the data to be programmed. The threshold value of each memory cell is set, for example, by implanting ions into the channel region of a memory transistor forming each memory cell or by accumulating charges in the floating gate thereof.

The respective word lines are provided so as to correspond to the respective rows of the memory cells, and a part of each word line functions as the gates of the memory transistors in the memory cell row corresponding to the word line. In this case, each of the word lines is formed of a poly-silicon layer, for example.

The sub-bit lines and the sub-ground lines are alternately arranged and are orthogonal to the word lines. A part of each sub-bit line functions as either one of a source and a drain for the memory transistors in the memory cell column, while a part of each sub-ground line functions as the other of the source and the drain for the memory transistors in the memory cell column. In addition, the sub-bit lines and the sub-ground lines can be formed by a diffusion region formed in the vicinity of the surface of a substrate. In this specification, a column of memory cells which are connected to one sub-bit line are called a "bank".

In a ROM having such a configuration, in the case of reading out the information from a particular memory cell included in a memory cell array, the bank Tr is made conductive based on a bank selection signal for selecting a bank to which this memory cell belongs, thereby electrically connecting a sub-bit line and a sub-ground line, which correspond to the bank, to the main bit line and the main ground line, respectively. In addition, the level of a particular word line connected to the memory cell is set to be high. As a result, a current corresponding to the threshold voltage of the selected memory cell flows through the main bit line, so that a predetermined bit line potential is generated and whereby the information stored in the particular memory cell can be read out.

On the other hand, in a ROM using a bank system disclosed in Japanese Laid-Open Patent Publication No. 6-104406, the amount of a bit line current is increased by improving the driving ability of a bank selection transistor, thereby increasing a readout margin.

Furthermore, a multivalent ROM, which is obtained by improving a bank system suggested in a digital ROM for increasing a storage density, is disclosed in Japanese Laid-Open Patent Publication No. 6-318683.

FIG. 20 is a block diagram showing a fundamental configuration for such a multivalent ROM 10. This multivalent ROM 10 includes a memory cell array 11, in which a plurality of memory cells are arranged in matrix. A plurality of sub-bit lines and a plurality of sub-ground lines are alternately arranged in the memory cell array 11. This memory cell array 11 has a plurality of memory cell array sections, each of which includes at least three sub-bit lines and at least two sub-ground lines. Each of the sub-bit lines is connected to a main bit line via a bank Tr and each of the sub-ground lines is connected to a main ground line via a bank Tr.

Each of the memory cells has any of four kinds of threshold values. Four bit line potentials, Vth0, Vth1, Vth2 and Vth3, are generated so as to correspond to these four kinds of threshold values. On the other hand, a reference voltage generator 13 generates three kinds of reference levels Ref1, Ref2 and Ref3 with respect to the bit line potentials. Each of these reference levels is set at an intermediate value between two bit line levels. A bit line potential and a reference level are input to a sense amplifier 12 and then compared with each other, so that the comparison result is input to a logical circuit 14. As a result, data corresponding to two bits D0 and D1 is read out from the logical circuit 14. In this way, data corresponding to two bits can be read out from a memory cell corresponding to one bit. In FIG. 20, the reference numeral 11a denotes a row decoder and 11b denotes a column decoder.

However, in a ROM using a bank system, if the number of sub-bit lines connected to one main bit line is increased, then the load capacitance of the main bit line is increased, so that the delay in reading out the data is also adversely increased. In addition, if the number of bank Tr connected to one main bit line or one main ground line is increased, then the number of bank selection signal lines is also increased. Thus, the area ratio of the bank Tr to the memory Tr is increased, so that it becomes difficult to highly integrate the memory cells.

On the other hand, if the number of memory cells included in one bank is increased, then the area ratio of the bank Tr to the memory Tr can be surely decreased. However, the length of the sub-bit lines and that of the sub-ground lines are increased, so that the resistance is increased in these lines. As a result, the bit line potential of a memory cell adversely becomes different depending upon the position of the memory cell in the bank to which the memory cell belongs, or the position of the memory cell on an identical memory cell column to which the memory cell belongs, so that a margin between the bit line potential and the reference level is decreased and whereby the delay in reading out the data is adversely increased. It is difficult to solve such a problem even if the amount of a bit line current is increased. This is because, even if the bit line current is increased, the bit line potential is still different depending upon the position in the bank.

Thus, in a ROM according to a conventional bank system, even when the memory cells included in a bank have an equal threshold value, the bit line potential is varied among the memory cells depending upon the positions thereof in the bank. This is because a resistance on a sub-bit line between a bank Tr and the drain of a memory transistor and a resistance on a sub-ground line between a bank Tr and the source of a memory transistor are varied depending upon the position of a memory cell in the bank to which the memory cell belongs.

In a ROM using a bank system, each of the sub-bit lines and the sub-ground lines is generally formed of a diffusion layer. Therefore, the bit line potential is considerably affected depending upon the position of a memory cell in the bank, because such a layer has a high resistance.

FIG. 24 shows a generally used configuration for a ROM 200 using a conventional bank system. In the ROM 200 according to this bank system, memory cells M1 and M2 are located on the side of a bank Tr 11 which is connected to a main bit line 41. In the memory cell M2, for example, the resistance on a sub-bit line 31 between the drain of the memory cell M2 and the bank Tr 11 is low, whereas the resistance on a sub-ground line 32 between the source of the memory cell M2 and a bank Tr 13 is high.

On the other hand, memory cells M6 and M7 are located on the side of the bank Tr 13 which is connected to a main bit line 42. In the memory cell M6, for example, the resistance on the sub-bit line 31 between the drain of the memory cell M6 and the bank Tr 11 is high, whereas the resistance on the sub-ground line 32 between the source of the memory cell M6 and the bank Tr 13 is low. In FIG. 24, M and M1 to M8 denote memory cells; 33 denotes a sub-bit line; 34 denotes a sub-ground line; 51 denotes a data line; 52 denotes a ground line; 12 and 14 denote bank Tr; 21 and 22 denote column selection transistors; Load denotes a load connected to the data line 51; WL1 to WL32 denote word lines; and BS1 to BS4 denote bank selection lines.

FIG. 25 shows another configuration for a ROM 200a using a conventional bank system. In FIG. 25, the same reference numerals as those used in FIG. 24 denote the same components as those of the ROM 200 shown in FIG. 24. In the ROM 200a, memory cells M1 to M4 are located in the vicinity of bank Tr 11 to 14. In the memory cell M3, for example, both the resistance on a sub-bit line 33 between the drain of the memory cell M3 and a bank Tr 13 and the resistance on a sub-ground line 32 between the source of the memory cell M3 and a bank Tr 12 are low.

On the other hand, memory cells M5 to M8 are located far away from the bank Tr 11 to 14. In the memory cell M7, for example, both the resistance on the sub-bit line 33 between the drain of the memory cell M7 and the bank Tr 13 and the resistance on the sub-ground line 32 between the source of the memory cell M7 and the bank Tr 12 are high.

The resistance value on a sub-bit line or a sub-ground line which is connected to a memory cell is varied in such a manner depending upon the distance between the memory cell and the bank Tr on the line. This is because each of the sub-bit lines and the sub-ground lines is formed of a diffusion layer and has a resistance higher than that of a main bit line or that of a main ground line which is formed of a metallic wiring.

On the other hand, in the multivalent ROM described above, readout is performed by making a sense amplifier compare a bit line potential with a reference level with respect to each threshold voltage. However, in such a multivalent ROM, there is a small margin, in particular, between the bit line potentials with respect to each threshold voltage. Therefore, if the bit line potential is varied, then a disaccord is caused between the bit line potential and the reference level, so that it becomes sometimes difficult to read out a correct value.

Next, it will be described how the current-voltage characteristics of a memory cell are varied depending upon the position of the memory cell in a bank to which the memory cell belongs.

FIG. 21 shows a relationship between the position of a memory cell in a memory cell array and a path of the current flowing through the memory cell. FIG. 22 shows in comparison the current-voltage characteristics which are plotted with respect to the current paths and the threshold values of memory cells as well as the current-voltage characteristics of a load L.

In the circuit configuration shown in FIG. 21, memory cells M1a and M2a are connected to a main bit line 41 and a main ground line 42 in accordance with bank selection signals BS1 and BS3, respectively. When the level of a word line WL2 is high, the memory cell M1a is selected. On the other hand, when the level of a word line WL31 is high, the memory cell M2a is selected.

In addition, since the memory cell M1a is disposed on the side of a first bank Tr 11 and the memory cell M2a is disposed on the side of a second bank Tr 13, the resistance value on a sub-bit line 31 between the drain of the memory cell M1a and the bank Tr 11 is relatively low, while the resistance value R2 on a sub-bit line 32 between the source of the memory cell M1a and the bank Tr 13 is relatively high. On the other hand, the resistance value R1 on the sub-bit line 31 between the drain of the memory cell M2a and the bank Tr 11 is relatively high, while the resistance value on the sub-bit line 32 between the source of the memory cell M2a and the bank Tr 13 is relatively low.

In this case, the resistance between the drain of a memory cell and the main bit line 41 becomes equal to the sum of the ON resistance of the bank Tr 11 and the wiring resistance of the sub-bit line 31, while the resistance between the source of a memory cell and the main bit line 42 becomes equal to the sum of the ON resistance of the bank Tr 13 and the wiring resistance of the sub-bit line 32.

When information stored in the memory cell M1a is read out, a current flows through a current path 1. On the other hand, when information stored in the memory cell M2a is read out, a current flows through a current path 2.

In this case, even when the threshold values of the memory cells are equal and the potentials of the word lines are equal, an increase in the source potential of a memory cell causes a decrease in a voltage Vgs between the gate and the source of the memory transistor forming the memory cell, so that the ON resistance of the memory cell is increased. As a result, a decrease in the bit line current causes a decrease in the bit line potential. In other words, the gate-source voltage Vgs is variable depending upon the position of the memory cell, so that the ON resistance of the memory cell is varied and whereby the bit line potential is also varied.

In addition, since the readout current flows through both of the memory cells M1a and M2a via the same load L, the relationship between the current flowing through the bit line and the potential generated in the bit line corresponds to the current paths and the threshold voltages of the memory cells as shown by the curves $K1_H$, $K1_L$, $K2_H$ and $K2_L$ in FIG. 22. In FIG. 22, the curves $K1_H$ and $K1_L$ plot the characteristics in the case of reading out the information stored in the memory cell M1a; $K1_H$ represents the characteristics obtained when the threshold value of the memory cell M1a is high; and $K1_L$ represents the characteristics obtained when the threshold value of the memory cell M1a is low. On the other hand, the curves $K2_H$ and $K^2L$ plot the characteristics in the case of reading out the information stored in the memory cell M2a; $K2_H$ represents the characteristics obtained when the threshold value of the memory cell M2a is high; and $K2_L$ represents the characteristics obtained when the threshold value of the memory cell M2a is low. Furthermore, the graph $L_O$ represents the current-voltage characteristics of the load L.

In the case of reading out the information stored in the memory cell M1a, the bit line potentials become the values a1 and a2 which correspond to the threshold values of the memory cell M1a. On the other hand, in the case of reading out the information stored in the memory cell M2a, the bit line potentials become the values b1 and b2 which correspond to the threshold values of the memory cell M2a.

Since the information is read out from a memory cell by making a sense amplifier compare a bit line potential and a reference potential, the variation in the bit line potential decreases the readout margin.

The ROM using a bank system disclosed in Japanese Laid-Open Patent Publication No. 5-167042 has a similar problem to that of the conventional ROM described above. Hereinafter, such a problem will be briefly described.

FIG. 23 shows an equivalent circuit of the ROM described in this publication. In the ROM having such a configuration, a main bit line 6 is connected to bit lines B1, B3 and B2 via column selection transistors Q11, Q12 and Q22, respectively, while a virtual ground line 7 is connected to bit lines B4, B3 and B5 via column selection transistors Q13, Q23 and Q24, respectively. In FIG. 23, Q denotes a column selection transistor and M denotes a memory cell.

In this case, in the case of reading the information stored in a memory cell M03, the levels of selection lines S1 and S2 become H (high) and L (low), respectively. When a word line WL0 is selected, a current path Y is established. On the other hand, in the case of reading the information stored in a memory cell M152, the levels of the selection lines S1 and S2 become L and H, respectively. When a word line WL15 rises, a current path X is established.

Herein, the level of the selection line S2 becomes H in the case of reading the information from the memory cells M02 to M152, while the level of the selection line S1 becomes H in the case of reading the information from the memory cells M03 to M153, so that an optimal current path corresponding to the positions of the memory cells cannot be established. Thus, a memory cell located near a selection line has a different resistance in a current path, established when the line is selected, from that of a memory cell located away from the selection line. Therefore, if the bit line potential is varied, then a disaccord is caused between the bit line potential and the reference level, so that it becomes difficult to read out a correct value.

SUMMARY OF THE INVENTION

The semiconductor storage device of this invention, includes: a memory cell array formed by arranging a plurality of memory cells in matrix, each of the plurality of memory cells being formed of a memory transistor; a first main bit line and a second main bit line for reading out information from a selected memory cell, a predetermined potential being applied to each of the first and second main bit lines; a plurality of first sub-bit lines and a plurality of second sub-bit lines which are provided so as to correspond to respective columns of the memory cells, each of the first and second sub-bit lines functioning as either a common source or a common drain for the memory transistors forming the memory cells; a plurality of word lines which are provided so as to correspond to respective rows of the memory cells, each of the word lines being connected to gates of the memory transistors forming the memory cells; a first bank selection transistor being connected between one of the first sub-bit lines and the first main bit line for selecting one of the columns of the memory cells; a second bank selection transistor being connected between one of the second sub-bit lines and the second main bit line for selecting one of the column of the memory cells; and bank selection lines each of which is provided for one of the bank selection transistors and connected to a gate thereof. A certain potential corresponding to a position of a selected word line in the memory cell array is applied to at least a selected one of the bank selection lines as an ON potential for the associated bank selection transistor.

In one embodiment, the selected bank selection line is connected to a selected bank selection transistor which is in turn connected to one of the first and second main bit lines, to which main bit line a lower potential is applied.

In another embodiment, the certain potential corresponding to the position of the selected word line in the memory cell array is applied to each of the bank selection lines as the ON potential for the associated bank selection transistors.

In still another embodiment, the plurality of word lines are divided in a direction along the columns of the memory cells such that a plurality of word line groups are formed, and the certain potential to be applied to the bank selection lines as the ON potential for the associated bank selection transistors is a potential corresponding to a site of the word line group, to which the selected word line belongs.

In still another embodiment, the selected bank selection line is connected to the selected bank selection transistor which is in turn connected to one of the first and second main bit lines, to which main bit line a lower potential is applied, and the certain potential to be supplied to the selected bank selection line becomes higher as a distance between the selected memory cell and the selected bank selection transistor becomes longer.

In still another embodiment, the semiconductor storage device further includes a reference voltage generator for generating the certain potential to be applied to the bank selection lines as the ON potential for the associated bank selection transistors, and a reference potential generated by the reference voltage generator is used as a power voltage for a bank selection line driver for driving the bank selection lines.

Preferably, the reference voltage generator includes: a plurality of resistive elements serially connected between a first reference potential and a second reference potential for resistively dividing a voltage between the two reference potentials; a plurality of divided switches, each of the divided switches being connected between one terminal of one of the resistive elements and a commonly connected node; a power supply switch having one terminal being connected to the first reference potential and the other terminal functioning as an output terminal for outputting the reference potential for the bank selection line driver therethrough; and a comparator for comparing a potential at the commonly connected node of the divided switches with a potential at the other terminal of the power supply switch, thereby outputting a potential corresponding to a comparison result as a voltage for controlling ON/OFF states of the power supply switch. A predetermined one of the plurality of divided switches is made conductive based on either a signal indicating the selected word line or a signal indicating the word line group to which the selected word line belongs, thereby generating a potential at a desired level at the output terminal of the power supply switch.

According to another aspect of the present invention, the semiconductor storage device includes: a memory cell array formed by arranging a plurality of memory cells in matrix, each of the plurality of memory cells being formed of a memory transistor; a plurality of bit lines which are provided so as to correspond to respective columns of the memory cells for reading out information from the memory cells; a plurality of word lines which are provided so as to correspond to respective rows of the memory cells, each of the word lines being connected to gates of the memory transistors forming the memory cells; a controller for generating a predetermined control signal in accordance with a position of a selected word line in the memory cell array; and a load circuit which is connected to at least one of the plurality of bit lines via a selection transistor and is configured such that load characteristics thereof are variable in accordance with the control signal.

According to still another aspect of the present invention, the semiconductor storage device comprising: a memory cell array formed by arranging a plurality of memory cells in matrix, each of the plurality of memory cells being formed of a memory transistor; a sub-bit line and a sub-ground line which are alternately arranged such that either the sub-bit line or the sub-ground line corresponds to each column of the memory cells; a data line for outputting data of the memory cells; a load circuit which is connected to the data line and is configured such that load characteristics thereof are variable in accordance with a predetermined control signal; a main bit line connected to the data line via a column selection transistor; a main ground line connected to a ground line via another column selection transistor; a first bank selection transistor, which is disposed on one side of the column of the memory cells in the memory cell array and is connected between the main bit line and the sub-bit line; a second bank selection transistors, which is disposed on the other side of the column of the memory cells in the memory cell array and is connected between the main ground line and the sub-ground line; and a plurality of word lines which are provided so as to correspond to respective rows of the memory cells and divided in a direction along the columns of the memory cells such that a plurality of word line groups are formed, each of the word lines being connected to gates of the memory transistors forming the memory cells. When one of the plurality of word lines is selected, the load characteristics of the load circuit are switched depending upon the control signal corresponding to the word line group to which the selected word line belongs.

Preferably, one or two of the sub-bit lines are connected to the main bit line via the first bank selection transistor, and at least two of the sub-ground lines are connected to the main ground line via the second bank selection transistor. When one of the first bank selection transistor and one of the second bank selection transistor are selected, the main bit line and the sub-bit line adjacent thereto are electrically connected with each other, and the main ground line and the sub-ground line adjacent thereto are electrically connected with each other.

According to still another aspect of the present invention, the semiconductor storage device include includes: a memory cell array formed by arranging a plurality of memory cells in matrix, each of the plurality of memory cells being formed of a memory transistor; a first sub-bit line, a second sub-bit line, a third sub-bit line and a fourth sub-bit line, which are repeatedly arranged in a predetermined order such that any one of the sub-bit lines corresponds to each column of the memory cells; a data line for outputting data of the memory cells; a load circuit which is connected to the data line and is configured such that load characteristics thereof are variable in accordance with a predetermined control signal; a main bit line connected to the data line via a column selection transistor; a main ground line connected to a ground line via another column selection transistor; and a plurality of word lines which are provided so as to correspond to respective rows of the memory cells and divided in a direction along the columns of the memory cells such that a plurality of word line groups are formed, each of the word lines being connected to gates of the memory transistors forming the memory cells. The first sub-bit line is connected to the main ground line via a first bank selection transistor on one side of the memory cell array and is connected to the main bit line via a second bank selection transistor on the other side of the memory cell array. The second sub-bit line is connected to the main ground line via the first and second bank selection transistors, respectively, on both sides of the memory cell array. The third sub-bit line is connected to the main bit line via the first bank selection transistor on one side of the memory cell array and is connected to the main ground line via the second bank selection transistor on the other side of the memory cell array. And the fourth sub-bit line is connected to the main bit line via the first and second bank selection transistors, respectively, on both sides of the memory cell array. When one of the plurality of word lines is selected, the load characteristics of the load circuit are switched depending upon a control signal corresponding to a word line group to which the selected word line belongs.

According to still another aspect of the present invention, the semiconductor storage device includes: a memory cell array formed by arranging a plurality of memory cells in matrix, each of the plurality of memory cells being formed of a memory transistor; a plurality of sub-bit lines which are provided so as to correspond to respective columns of the memory cells; a data line for outputting data of the memory cells; a first main bit line and a second main bit line which are connected to the data line via a first column selection transistor and to a ground line via a second column selection transistor; a first bank selection transistor connected to the first main bit line and one of two adjacent sub-bit lines; a second bank selection transistor connected to the second main bit line and the other of the two adjacent sub-bit lines; a plurality of word lines which are provided so as to correspond to respective rows of the memory cells, each of the word lines being connected to gates of the memory transistors forming the memory cells; a controller for generating a predetermined control signal in accordance with a position of a selected word line in the memory cell array. A first state, where the first main bit line is electrically connected to the data line and the second main bit line is electrically connected to the ground line, and a second state, where the first main bit line is electrically connected to the ground line and the second main bit line is electrically connected to the data line, are selected in accordance with the control signal.

According to still another aspect of the present invention, the semiconductor storage device includes: a memory cell array formed by arranging a plurality of memory cells in matrix, each of the plurality of memory cells being formed of a memory transistor; a first sub-bit line and a second sub-bit line which are alternately provided such that either one of the first sub-bit line and the second sub-bit line corresponds to each column of the memory cells; a data line for outputting data of the memory cells; a first main bit line which is connected to the data line via a first column selection transistor and to a ground line via a second column selection transistor; a second main bit line which is connected to the data line via a third column selection transistor and to the ground line via a fourth column selection transistor; a first bank selection transistor which is disposed on one side of the column of the memory cells in the memory cell array and is connected between the first main bit line and the first sub-bit line; a second bank selection transistor which is disposed on the other side of the column of the memory cells in the memory cell array and is connected between the second main bit line and the second sub-bit line; and a plurality of word lines which are provided so as to correspond to respective rows of the memory cells and divided into a first word line group which are located on a side of the first bank selection transistor, and a second word line group which are located on a side of the second bank selection transistor, each of the word lines being connected to gates of the memory transistors forming the memory cells. When one of the word lines belonging to the first word line group is selected, the second and third column selection transistors are selected, so that the first main bit line is electrically connected to the ground line and the second main bit line is electrically connected to the data line. When one of the word lines belonging to the second word line group is selected, the first and the fourth column selection transistors are selected, so that the second main bit line is electrically connected to the ground line and the first main bit line is electrically connected to the data line.

Preferably, each of the first word line group and the second word line group is divided into two or more word line sub-groups, and a load circuit is provided which is connected to the data line and configured such that load characteristics thereof are variable in accordance with a predetermined control signal, and when one of the word lines is selected, the load characteristics of the load circuit are switched in accordance with a control signal corresponding to the word line sub-group, to which the selected word line belongs.

In one embodiment, each of the memory cells is configured so as to retain information corresponding to three or more potential levels forming a multivalent ROM.

In another embodiment, a plurality of memory cell arrays are provided on a semiconductor substrate, each of the memory cell arrays comprising a plurality of memory cells which are connected to one of the main bit lines and one of the main ground lines, and an isolation region for electrically isolating adjacent ones of the plurality of memory cell arrays are formed by a plurality of isolating memory cells provided in a column direction, a threshold value of each of the isolating memory cells being set such that the memory transistor of the memory cell is always in a non-conductive state irrespective of whether the memory cell is in a selected state or in a non-selected state.

Preferably, the threshold value of each of the isolating memory cells is set by implanting ions into a region of the memory transistor forming the memory cell.

Furthermore, each of the memory cells has any of at least two threshold values, and one of these threshold values of the memory cells is set such that the memory transistor of the memory cell is always in a non-conductive state irrespective of whether the memory cell is in a selected state or in a non-selected state, and the threshold value of the memory cells is equal to the threshold value of the isolating memory cells.

Hereinafter, the functions obtainable by the present invention will be described.

According to the present invention, a potential corresponding to a position of a word line selected from the memory cell array is applied to a bank selection line, which is connected to the gate of a bank selection transistor, as an ON potential for the bank selection transistor, so that it is possible to reduce the variation in the bit line potential depending upon the position of a memory cell in a bank of a ROM using a bank system.

Particularly, by varying the potential of a bank selection line (or a gate potential), the ON resistance of a bank Tr can be varied. Therefore, in the case of reading out information stored in a memory cell disposed in the vicinity of a bank Tr on the drain side of the memory cell, the potential of the bank selection line associated with the bank Tr on the drain side is set to be low and the potential of the bank selection line associated with a bank Tr on the source side is set to be high. On the other hand, in the case of reading out information stored in a memory cell disposed in the vicinity of a bank Tr on the source side of a memory cell, the potential of the bank selection line associated with the bank Tr on the drain side is set to be high and the potential of the bank selection line associated with the bank Tr on the source side is set to be low. As a result, it is possible to reduce the difference between the sum of the wiring resistance of a sub-bit line on the drain side of a memory cell and the ON resistance of a bank Tr on the sub-bit line and the sum of the wiring resistance of a sub-bit line on the source side of a memory cell and the ON resistance of a bank Tr on the sub-bit line depending upon the position of the memory cell in a bank.

In addition, according to the present invention, a potential corresponding to the position of a word line selected from the memory cell array is applied to a bank selection line of a bank selection transistor which is connected to either the first main bit line or the second main bit line, to which main bit line a lower potential is applied, as an ON potential for the bank selection transistor. Thus, it is possible to reduce the variation in the bit line potential depending upon the position of a memory cell in a bank in a ROM using a bank system.

In brief, since a bank Tr on the drain side of a memory cell has a smaller source-drain voltage Vds and a smaller gate-source voltage Vgs as compared with a bank Tr on the source side of the memory cell, the bank Tr on the drain side has a higher ON resistance and is less affected by a resistance on a sub-bit line.

Therefore, by varying the potential of the bank selection line of a bank Tr on the source side only, i.e., by setting the potential of the bank selection line of a bank Tr on the source side to be high in the case of reading out information stored in a memory cell disposed in the vicinity of a bank Tr on the drain side of the memory cell, or by setting the potential of the bank selection line of a bank Tr on the source side to be low in the case of reading out information stored in a memory cell disposed in the vicinity of a bank Tr on the source side of the memory cell, the difference between the sum of the wiring resistance of a sub-bit line on the drain side of a memory cell and the ON resistance of a bank Tr on the sub-bit line and the sum of the wiring resistance of a sub-bit line on the source side of a memory cell and the ON resistance of a bank Tr on the sub-bit line depending upon the position of the memory cell in a bank can be reduced under a simplified configuration.

Furthermore, according to the present invention, a plurality of word lines are divided in a direction along the columns of the memory cells such that a plurality of word line groups are formed. A potential corresponding to the site of a word line group, to which a selected word line belongs, in the memory cell array is applied to a bank selection line as an ON potential for the bank selection transistor on the bank selection line. Thus, it is possible to suppress the variation in the bit line potential depending upon the position of the memory cell in a bank under a simplified configuration without any need for changing the potential of a bank selection line for each word line.

Furthermore, according to the present invention, a potential is applied to the bank selection line of a bank selection transistor which is connected to either the first main bit line or the second main bit line, to which main bit line a lower potential is applied, as an ON potential for the bank selection transistor such that the potential becomes higher as a distance between a selected memory cell and the bank selection transistor becomes longer. Thus, it is possible to suppress the variation in the bit line potential depending upon the position of the memory cell in a bank.

Specifically, the resistance between the source of a memory cell and the main bit line becomes equal to the sum of the wiring resistance of a sub-bit line and the ON resistance of a bank Tr. The wiring resistance of a sub-bit line becomes higher as the distance between the memory cell and the bank Tr becomes longer. Therefore, by setting the potential of the bank selection line of a bank Tr on the source side of a memory cell to be higher as the sub-bit line between the memory cell and the bank Tr becomes longer, the ON resistance of the bank Tr can be reduced and the sum of the wiring resistance of the sub-bit line and the ON resistance of the bank Tr can be set to be constant irrespective of the position of a memory cell in a bank.

According to the present invention, a reference voltage generator for generating a desired reference voltage to be applied to a bank selection line in accordance with a selected word line is configured such that a predetermined one of a plurality of divided switches is made conductive based on a signal indicating the selected word line or a signal indicating a word line group to which the selected word line belongs and whereby a potential at a desired level is generated at the output terminal of a power supply switch. Thus, a desired reference voltage to be applied to the bank selection line can be generated only by applying a selection signal for a word line to the divided switch.

According to the present invention, there provided a controller for generating a predetermined control signal in accordance with the position of a selected word line in the memory cell array and a load circuit which is connected to at least one of the plurality of bit lines via a selection transistor and is configured such that the load characteristics thereof are variable in accordance with the control signal. Thus, it is possible to reduce the variation in the bit line potential depending upon the position of a memory cell in a bank in a ROM using a bank system and increase a readout margin.

According to the present invention, a load circuit which is connected to the data line and is configured such that the load characteristics thereof are variable in accordance with a predetermined control signal is provided; a plurality of word lines are divided in a direction along the columns of the memory cells such that a plurality of word line groups are formed; and, when one of the plurality of word lines is selected, the characteristics of the load circuit are switched depending upon a control signal corresponding to a word line group to which the selected word line belongs. Thus, it is possible to suppress the variation in the bit line potential depending upon the position of a memory cell in a bank under a simplified configuration without any need for changing the characteristics of the load circuit for each word line.

According to the present invention, one or two of the sub-bit lines is/are connected to one main bit line, so that the increase in the load capacitance of the main bit line can be suppressed to a minimum level and whereby the increase in the readout delay can be suppressed.

According to the present invention, a controller for generating a predetermined control signal in accordance with the position of a selected word line in the memory cell array is provided, and a state where the first main bit line and the second main bit line are electrically connected to the data line and the ground line, respectively, or a state where the first main bit line and the second main bit line are electrically connected to the ground line and the data line, respectively, is selected in accordance with the control signal. Thus, it is possible to suppress the variation in the bit line potential depending upon the position of a memory cell in a bank under a simplified configuration.

According to the present invention, each of the first word line group and the second word line group, obtained by dividing the word lines, is further divided into at least two word line subgroups; a load circuit which is connected to the data line is configured such that the load characteristics thereof are variable in accordance with a predetermined control signal; and, when one of the word lines is selected, characteristics of the load circuit are switched in accordance with a control signal corresponding to the word line subgroup, to which the word line belongs. Thus, it is possible to suppress more effectively the variation in the bit line potential depending upon the position of a memory cell in a bank.

According to the present invention, each of the memory cells is configured so as to retain information corresponding to three or more potential levels forming a multivalent ROM, so that a readout failure becomes unlikely to be caused in a multivalent ROM having a small margin between each bit line potential and each threshold voltage depending upon the position of a memory cell in a bank.

According to the present invention, an isolation region for electrically isolating adjacent ones of the plurality of memory cell arrays is formed to include a plurality of isolating memory cells in a column direction, the threshold value of each of the isolating memory cells being set such that the memory transistor of each memory cell is always in a non-conductive state irrespective of whether the memory cell is in a selection state or in a non-selection state. Thus, it is possible to electrically isolate adjacent memory cell arrays; prevent a leakage current from being generated from an adjacent memory cell array; stably read out information from the memory cells; reduce the area of the isolation region as compared with the case where an isolation region is formed of an insulating oxide film; easily adapt the characteristics of a memory cell adjacent to the element isolation region with those of an internal memory cell; and read out the information more stably.

According to the present invention, the non-conductive memory cell is fabricated by implanting ions for controlling a threshold value. As a result, the isolation region of the memory cell array can be easily formed by simply changing the dose in the ion implantation process.

According to the present invention, one of threshold values of a memory Tr constituting the multivalent ROM is set equal to the threshold value of a memory Tr for isolating the elements. Consequently, it is possible to simplify the fabrication process steps of the memory cell or those of the element isolation region.

Thus, the invention described herein makes possible the advantage of providing a semiconductor storage device which can reduce the variation of the level of a potential, read out on a bit line, depending upon a position of a memory cell in a bank to which the memory cell belongs, thereby improving a readout margin.

This and other advantages of the present invention will become apparent to those skilled in the art upon reading and understanding the following detailed description with reference to the accompanying figures.

BRIEF DESCRIPTION OF THE DRAWINGS

FIG. 11A shows a part of the memory cell array of the ROM; FIG. 11B shows a configuration for a switching circuit used in the ROM for selecting the connection between a main bit line and a data line or the connection between the main bit line and a ground line; and FIG. 11C shows a specific configuration for the switching circuit.

FIG. 12A shows a part of the memory cell array of the ROM; and FIG. 12B shows a specific configuration for a circuit for generating a switching signal LS1.

DESCRIPTION OF THE PREFERRED EMBODIMENTS

Hereinafter, the present invention will be described by way of illustrative examples with reference to the accompanying drawings.

EXAMPLE 1

Figure 1:
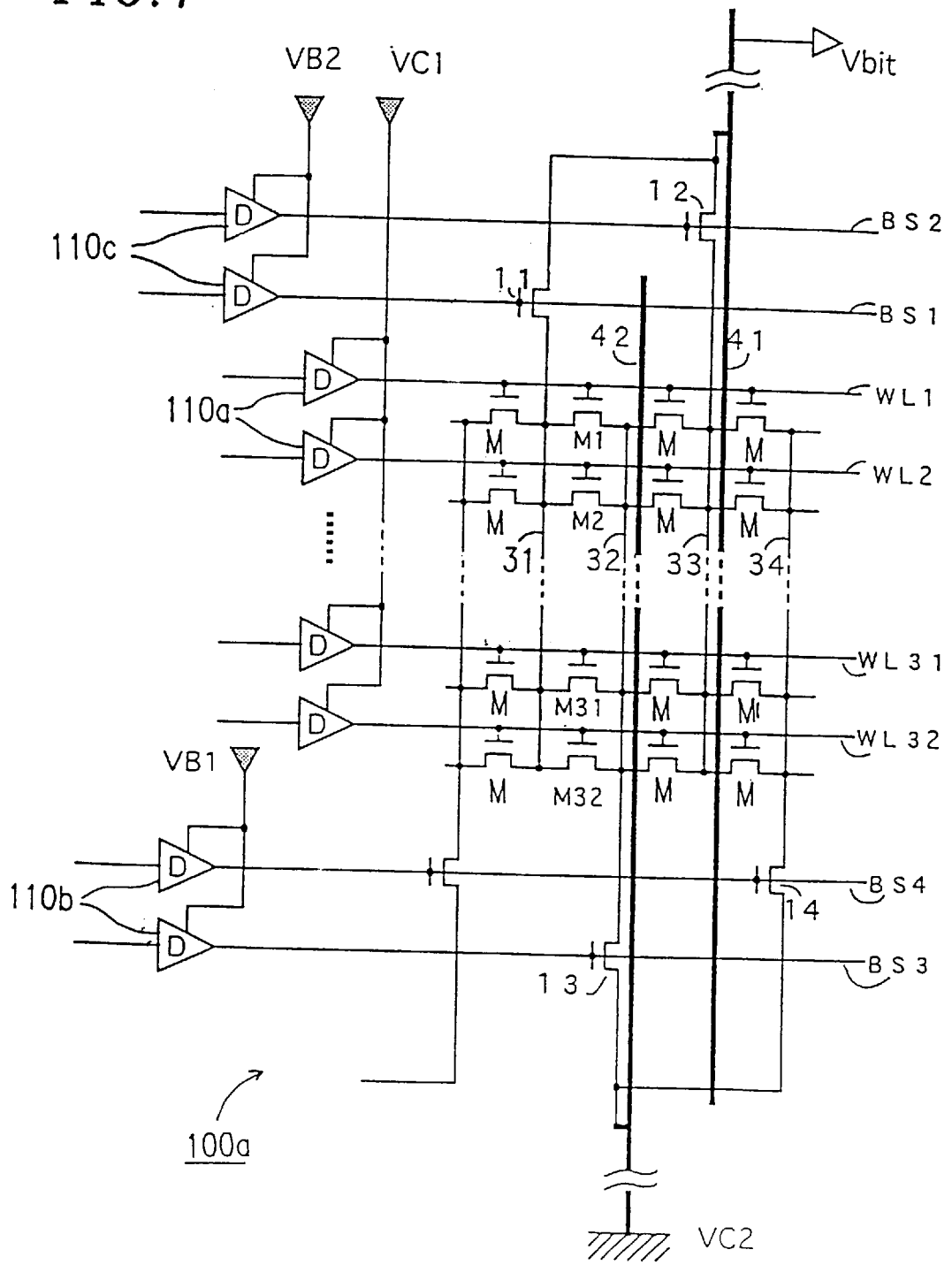
FIG. 1 is a circuit diagram illustrating a ROM using a bank system as a semiconductor storage device in a first example of the present invention, particularly showing a memory cell array and a part of the peripheral circuits thereof as the components of the ROM.

FIG. 1 is a circuit diagram illustrating a ROM using a bank system as a semiconductor storage device in a first example of the present invention. Particularly, it shows a memory cell array and a part of the peripheral circuits thereof as the components of the ROM.

In FIG. 1, the reference numeral 100a denotes the ROM using a bank system in the first example. The ROM 100a includes: a memory cell array formed by arranging in matrix a plurality of memory cells M, M1, M2, M31 and M32, each of which is formed of a memory transistor; and a first main bit line 41 and a second main bit line 42 for reading out the information from the selected memory cell. A predetermined power potential is applied to the main bit line 41, while a ground potential is applied to the second main bit line 42.

The memory cell array of the ROM 100a is further provided with first sub-bit lines 31 and 33 and second sub-bit lines 32 and 34 so as to correspond to the respective columns of the memory cells. Each of the first sub-bit lines 31 and 33 functions as a common drain for the memory transistors forming the memory cells in the column corresponding to the first sub-bit line, while each of the second sub-bit lines 32 and 34 functions as a common source for the memory transistors forming the memory cells in the column corresponding to the second sub-bit line.

The memory cell array of the ROM 100a is further provided with a plurality of word lines WL1, WL2, . . . WL31 and WL32 so as to correspond to the respective rows of the memory cells. Each of the word lines is connected to the gates of the memory transistors forming the memory cells in the row corresponding to the word line. A first bank selection transistor 11 for selecting a column of memory cells is connected between the first sub-bit line 31 and the first main bit line 41 and a first bank selection transistor 12 for selecting a column of memory cells is connected between the first sub-bit line 33 and the first main bit line 41. On the other hand, a second bank selection transistor 13 for selecting a column of memory cells is connected between the second sub-bit line 32 and the second main bit line 42 and a second bank selection transistor 14 for selecting a column of memory cells is connected between the second sub-bit line 34 and the second main bit line 42. Bank selection lines BS1 to BS4 are connected to the respective gates of the bank selection transistors 11 to 14.

In this example, each word line is connected to a driver 110a to which a power potential VC1 is supplied. The driver 110a is configured to drive the corresponding word line in accordance with a word line selection signal supplied from a row address decoder.

In addition, each of the bank selection lines BS1 and BS2 is connected to a diver 110c to which a power potential VB2 is supplied; each of the bank selection lines BS3 and BS4 is connected to a diver 110b to which a power potential VB1 is supplied; and each of the drivers 110b and 110c is configured to drive the corresponding bank selection line in accordance with a bank selection signal supplied from a column decoder.

Furthermore, in the first example, a potential corresponding to the position of a word line selected from the memory cell array is applied to each of the bank selection lines as an ON potential for the bank selection transistor corresponding to the bank selection line.

Figure 4:
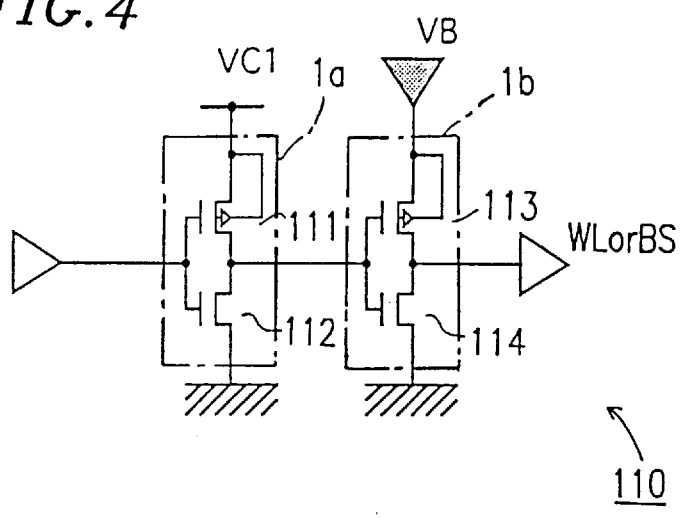
FIG. 4 is a diagram showing an exemplary specific circuit configuration for a driver which is used in the ROM of the first to the third examples for driving word lines and bank selection lines.

FIG. 4 shows a specific circuit configuration for the driver 110 for driving the word lines and the bank selection lines. The driver 110 includes a first-stage driver circuit 1a and a second-stage driver circuit 1b. The first-stage driver circuit 1a is serially connected between a first power supply for generating the potential VC1 and a ground potential and includes a p-channel MOSFET 111 and an n-channel MOS-FET 112, the gates of which are commonly connected. The common gate of the MOSFETs 111 and 112 functions as the signal input terminal of the driver 110.

On the other hand, the second-stage driver circuit 1b is serially connected between a second power supply for generating the potential VB and a ground potential and includes a p-channel MOSFET 113 and an n-channel MOS-FET 114, the gates of which are commonly connected. The common gate of the MOSFETs 113 and 114 is connected to the connection point of the MOSFETs 111 and 112 forming the first-stage driver circuit 1a, and the connection point of the MOSFETs 113 and 114 functions as the output terminal of the driver 110.

It should be appreciated that the circuit configuration of the driver is not limited to that shown in FIG. 4. Alternatively, a circuit configuration such as that shown in FIG. 5 may also be used.

Figure 5:
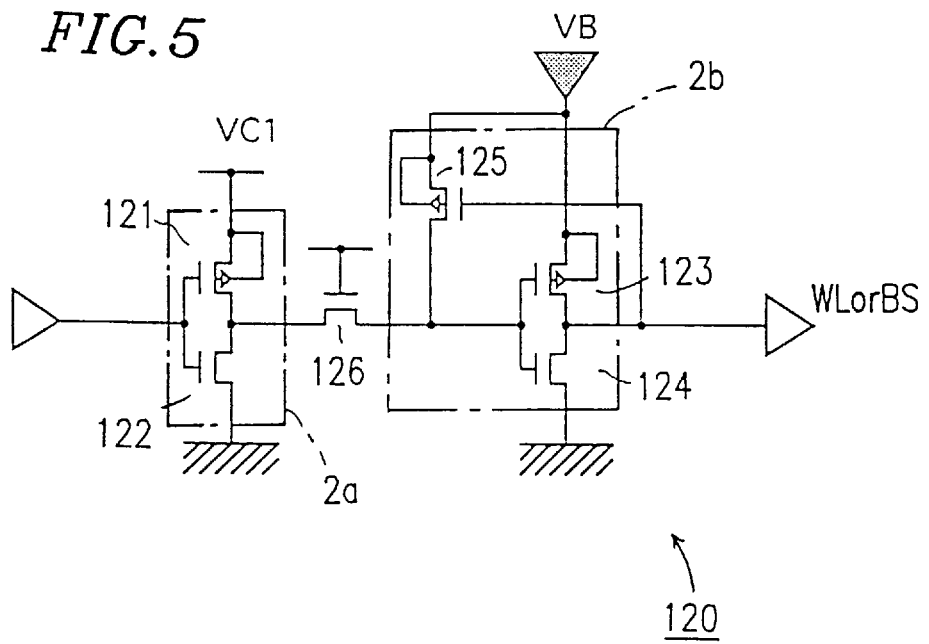
FIG. 5 is a diagram showing another exemplary specific circuit configuration for a driver which is used in the ROM of the first to the third examples for driving word lines and bank selection lines.

In FIG. 5, the reference numeral 120 denotes a driver used for driving the word lines and the bank selection lines. The driver 120 includes a first-stage driver circuit 2a and a second-stage driver circuit 2b. The first-stage driver circuit 2a is serially connected between a first power supply for generating the potential VC1 and a ground potential and includes a p-channel MOSFET 121 and an n-channel MOS-FET 122, the gates of which are commonly connected. The common gate of the MOSFETs 121 and 122 functions as the signal input terminal of the driver 120.

On the other hand, the second-stage driver circuit 2b is serially connected between a second power supply for generating the potential VB and a ground potential and includes: a p-channel MOSFET 123 and an n-channel MOS-FET 124, the gates of which are commonly connected; and another p-channel MOSFET 125 connected between the second power supply and the common gate of the MOSFETs 123 and 124. The common gate of the MOSFETs 123 and 124 is connected to the connection point of the MOSFETs 121 and 122 forming the first-stage driver circuit 2a via another n-channel MOSFET 126. The gate of the MOSFET 125 is connected to the connection point of the MOSFETs 123 and 124 and the connection point functions as the output terminal of the driver 120. In this example, the potential VC1 of the first power supply is supplied to the gate of the n-channel MOSFET 126.

Figure 6:
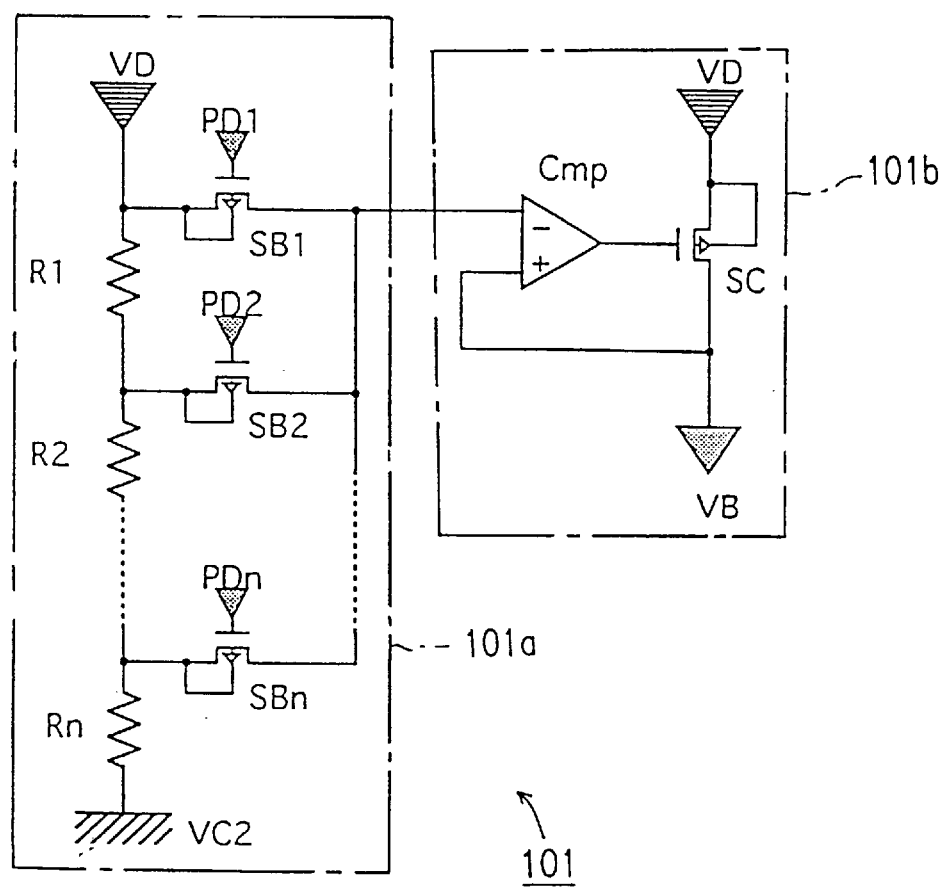
FIG. 6 is a diagram showing a specific circuit configuration for a variable power supply circuit which is used in the ROM of the first to the third examples for supplying a power potential to a driver for bank selection line.

FIG. 6 is a diagram showing a specific circuit configuration for a power supply circuit for supplying a power potential to the second-stage driver circuit of a driver for driving the bank selection lines.

In FIG. 6, the reference numeral 101 denotes a power supply circuit, the output potential of which can be adjusted. The power supply circuit 101 includes a voltage control circuit 101a and a voltage output circuit circuit 101b. The voltage control circuit 101a is serially connected between a reference potential VD and a ground potential VC2 and includes a number n of resistances R1 to Rn for dividing the reference potential VD and a number n of switches SB1 to SBn, each of the switches being formed of a p-channel MOSFET. The drain of each p-channel MOSFET is connected to one terminal of the corresponding resistance on the side of the reference potential VD and the sources of the respective MOSFETs are commonly connected with each other. In this case, control signals PD1 to PDn for turning on/off the switches SB1 to SBn are applied to the gates of the respective p-channel MOSFETs forming the switches SB1 to SBn.

On the other hand, the voltage output circuit 101b includes: a comparator Cmp, the inverted input of which is connected to the common connection point of the switches SB1 to SBn in the voltage control circuit 101a; and a power supply switch SC which is formed of a p-channel MOSFET and has a source connected to the reference potential VD. The drain of the MOSFET forming the power supply switch SC functions as the output terminal of the power supply circuit 101 and the output terminal is connected to the non-inverted input of the comparator Cmp.

In the power supply circuit 101 having such a configuration, a predetermined reference potential VB corresponding to the potential at the node on the side of the reference potential VD of each resistance is generated in the drain of the power supply switch SC.

It is noted that a power supply for generating the reference potential VC1 can also be used as a power supply for generating the reference potential VD. Alternatively, a potential which has been generated inside or outside a ROM chip and is different from the reference potential VC1 can also be used.

Therefore, by making a predetermined one of the divided switches SB1 to SBn conductive in accordance with the selected word line, the voltage at the node on the side of the reference potential VD of each resistance is output as the reference potential VB.

In the first example, control signals PD32 to PD1 are made to correspond to the word lines WL1 to WL32 in the power supply circuit 101 (see FIG. 6) for supplying the power potential VB2 to the drivers of the bank selection lines BS1 and BS2. For example, when the word line WL1 is selected, the divided switch SB32 is made conductive in accordance with the control signal PD32.

On the other hand, control signals PD1 to PD32 are made to correspond to the word lines WL1 to WL32 in the power supply circuit 101 (see FIG. 6) for supplying the power potential VB1 to the drivers of the bank selection lines BS3 and BS4. For example, when the word line WL1 is selected, the divided switch SB1 is made conductive in accordance with the control signal PD1.

Next, functions or effects attainable in the first example will be described.

When information is read out from the memory cells in the bank to which the memory cells M1, M2, ... M31, M32 belong, the bank Tr's 11 and 13 are selected through the bank selection lines BS1 and BS3 and predetermined word lines are selected.

In this case, in the memory cell M1 located on the side of the bank Tr 11, a resistance on the sub-bit line 31 between the drain of the memory cell M1 and the bank Tr 11 is low, while a resistance on the sub-bit line 32 between the source of the memory cell M1 and the bank Tr 13 is high.

On the other hand, in the memory cell M32 located on the side of the bank Tr 13, a resistance on the sub-bit line 31 between the drain of the memory cell M32 and the bank Tr 11 is high, while a resistance on the sub-bit line 32 between the source of the memory cell M32 and the bank Tr 13 is low in contrast with the case of the memory cell M1.

Furthermore, the resistance between the drain of the memory cell M1 and the main bit line 41 or between the drain of the memory cell M32 and the main bit line 41 becomes equal to the sum of the ON resistance of the bank Tr 11 and the wiring resistance of the sub-bit line 31, while the resistance between the source of the memory cell M1 and the main bit line 42 or between the source of the memory cell M32 and the main bit line 42 becomes equal to the sum of the ON resistance of the bank Tr 13 and the wiring resistance of the sub-bit line 32.

Assuming that the voltage applied to the bank selection lines BS1 and BS3 as an ON potential for the bank Tr's 11 and 13 is a constant reference potential, the source potential of the particular memory cell and the source potential of the bank Tr 11 become higher in the case of reading out information from the memory cell M1 as compared with the case of reading out information from the memory cell M32. As a result, the ON resistances of the memory transistor and the bank Tr become high, the amount of the bit line current is decreased and the potential of the main bit line 41 becomes higher.

In the first example, in the case of reading out information from the memory cell M1, the gate potential BS1 of the bank Tr 11 is set to be lower and the gate potential BS3 of the bank Tr 13 is set to be higher as compared with the case of reading out information from the memory cell M32. As a result, the ON resistances of the bank Tr's 11 and 13 can be varied; the sum of the wiring resistance of a sub-bit line between the drain of each memory transistor and a bank Tr corresponding to the memory transistor and the ON resistance of the bank Tr can be made constant; and the sum of the wiring resistance of a sub-bit line between the source of each memory transistor and a bank Tr corresponding to the memory transistor and the ON resistance of the bank Tr can also be made constant.

Consequently, when the threshold voltages of the memory cells are equal to each other, then a constant potential Vbit corresponding to the threshold value of a selected memory cell can be read out on the bit line irrespective of the position of the memory cell in the bank to which the memory cell belongs.

EXAMPLE 2

Figure 2:
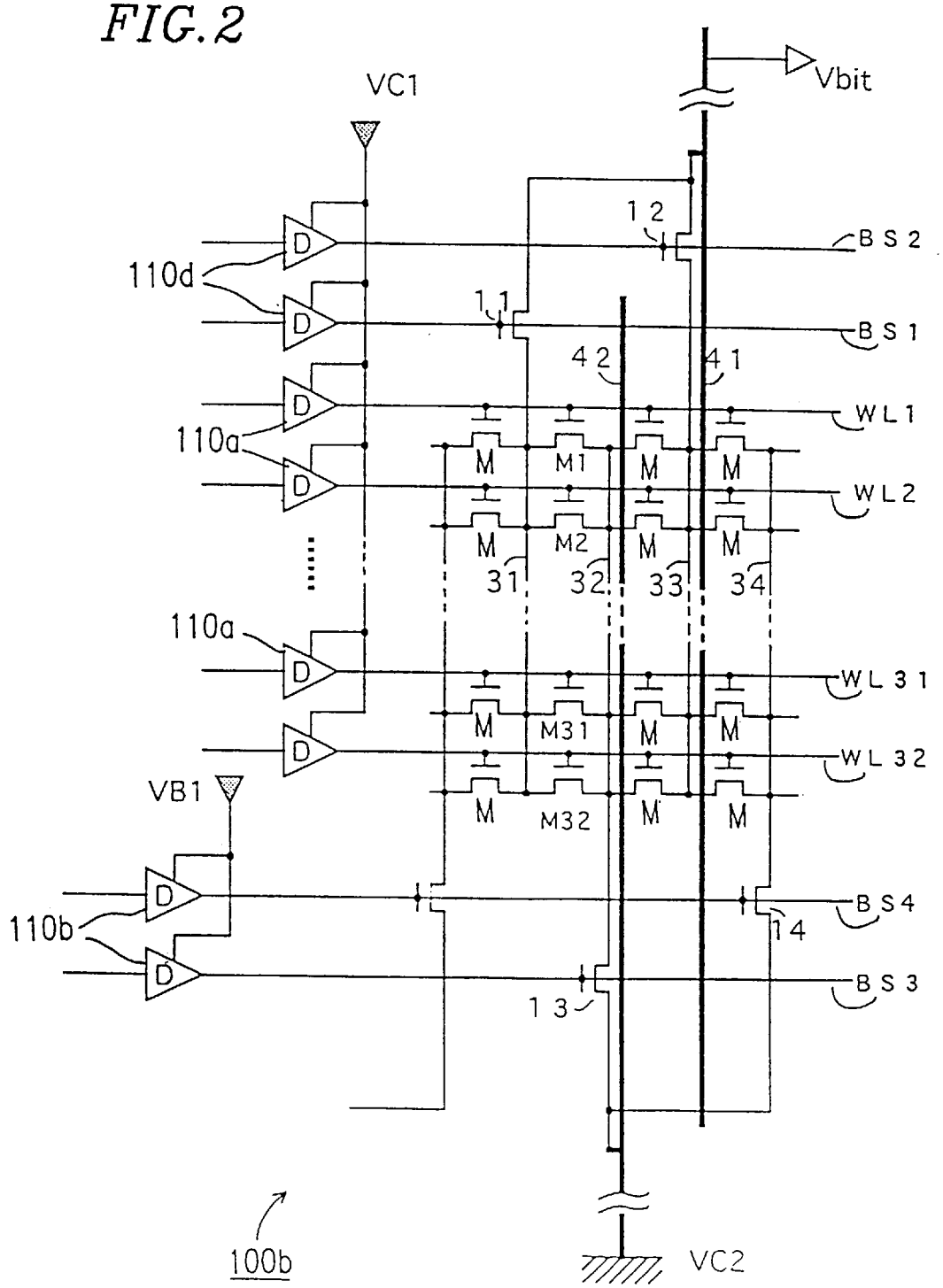
FIG. 2 is a circuit diagram illustrating a ROM using a bank system as a semiconductor storage device in a second example of the present invention, particularly showing a memory cell array and a part of the peripheral circuits thereof as the components of the ROM.

FIG. 2 is a circuit diagram illustrating a ROM using a bank system as a semiconductor storage device in a second example of the present invention. Particularly, it shows a memory cell array and a part of the peripheral circuits thereof as the components of the ROM.

In FIG. 2, the reference numeral 100b denotes a ROM using a bank system in the second example, and the same reference numerals as those used in FIG. 1 denote the same components as those of the ROM 110a in the first example.

In the second example, a constant reference potential is applied to the bank selection lines BS1 and BS2, which are connected to the gates of the bank Tr's 11 and 12 on the drain side of the memory cells, respectively, as the ON potential of the bank Tr's 11 and 12 irrespective of the position of the selected word line. The remaining configuration of the ROM 100b of the second example is the same as that of the ROM 100a of the first example. Thus, the same power potential as that is supplied to the drivers 110a for driving the word lines is supplied to the drivers 110d for driving the bank selection lines BS1 and BS2.

Therefore, in the second example, only the ON potential applied to the gates of the bank Tr's 13 and 14 on the source side of the respective memory cells, i.e., to the bank selection lines BS3 and BS4, is varied in accordance with the position of the selected word line.

On the other hand, in the power supply circuit 101 (see FIG. 6) for supplying the power potential VB1 to the drivers 110b of the bank selection lines BS3 and BS4, control signals PD1 to PD32 are made to correspond to the word lines WL1 to WL32. For example, when the word line WL1 is selected, the divided switch SB1 is made conductive in accordance with the control signal PD1.

Next, functions or effects attainable in the second example will be described.

Since a higher voltage is applied to the drain and the source of each of the bank Tr's 11 and 12 on the drain side of the respective memory cells as compared with the bank Tr's 13 and 14 on the source side of the memory cells, the drain-source voltage Vds and the gate-source voltage Vgs of the bank Tr's 11 and 12 on the drain side are lower than those of the bank Tr's 13 and 14 on the source side of the memory cells. Therefore, the bank Tr's 11 and 12 on the drain side have a higher ON resistance than that of the bank Tr's 13 and 14 on the source side. In addition, as compared with the bank Tr's 13 and 14 on the source side, the bit line potential is less affected by the difference in the wiring resistance of the sub-bit line between the bank Tr 11 or 12 on the drain side and the memory cell corresponding to the bank Tr.

Therefore, in the second example, only the potential to be applied as an ON potential to the gates of the bank Tr's 13 and 14 on the source side, in which the bit line potential is considerably affected by the difference in the wiring resistance of the sub-bit line between the bank Tr 13 or 14 on the source side and the corresponding memory cell, i.e., only the potential to be applied to the bank selection lines BS3 and BS4, is varied in accordance with the position of the selected word line.

In this example, the resistance between the source of the memory cell M1 and the main bit line 42 as well as the resistance between the source of the memory cell M32 and the main bit line 42 becomes equal to the sum of the ON resistance of the bank Tr 13 and the wiring resistance of the sub-bit line 32.

In the memory cell M1 located on the side of the bank Tr 11, the wiring resistance of the sub-bit line 32 between the source of the memory cell M1 and the bank Tr 13 is high. On the other hand, in the memory cell M32 located on the side of the bank Tr 13, the wiring resistance of the sub-bit line 32 between the source of the memory cell M32 and the bank Tr 13 is low.

Assuming that the potential applied to each of the bank selection lines BS1 and BS3 as an ON potential for the bank Tr 11 or 13 is a constant reference potential, the source potential of the memory cell M1 and the source potential of the particular bank Tr become higher in the case of reading out information from the memory cell M1 as compared with the case of reading out information from the memory cell M32. As a result, the ON resistances of the memory transistors and the bank Tr become high and the amount of the bit line potential is decreased, so that the bit line potential becomes higher.

In the second example, in the case of reading out information from the memory cell M1, the ON potential to be applied to the gate of the bank Tr 13, i.e., the bank selection line BS3, is set to be higher as compared with the case of reading out information from the memory cell M32. As a result, the ON resistance of the bank Tr 13 can be reduced and the sum of the wiring resistance of the sub-bit line 32 connected to the sources of the memory transistors and the ON resistance of the bank Tr 13 can be made constant.

Consequently, when the threshold voltages of the memory cells are equal to each other, then the potential Vbit read out on the bit line can be set at a substantially constant value corresponding to the threshold value of the respective memory cells under a simpler configuration than that of the first example irrespective of the position of a memory cell in the bank to which the memory cell belongs.

EXAMPLE 3

Figure 3:
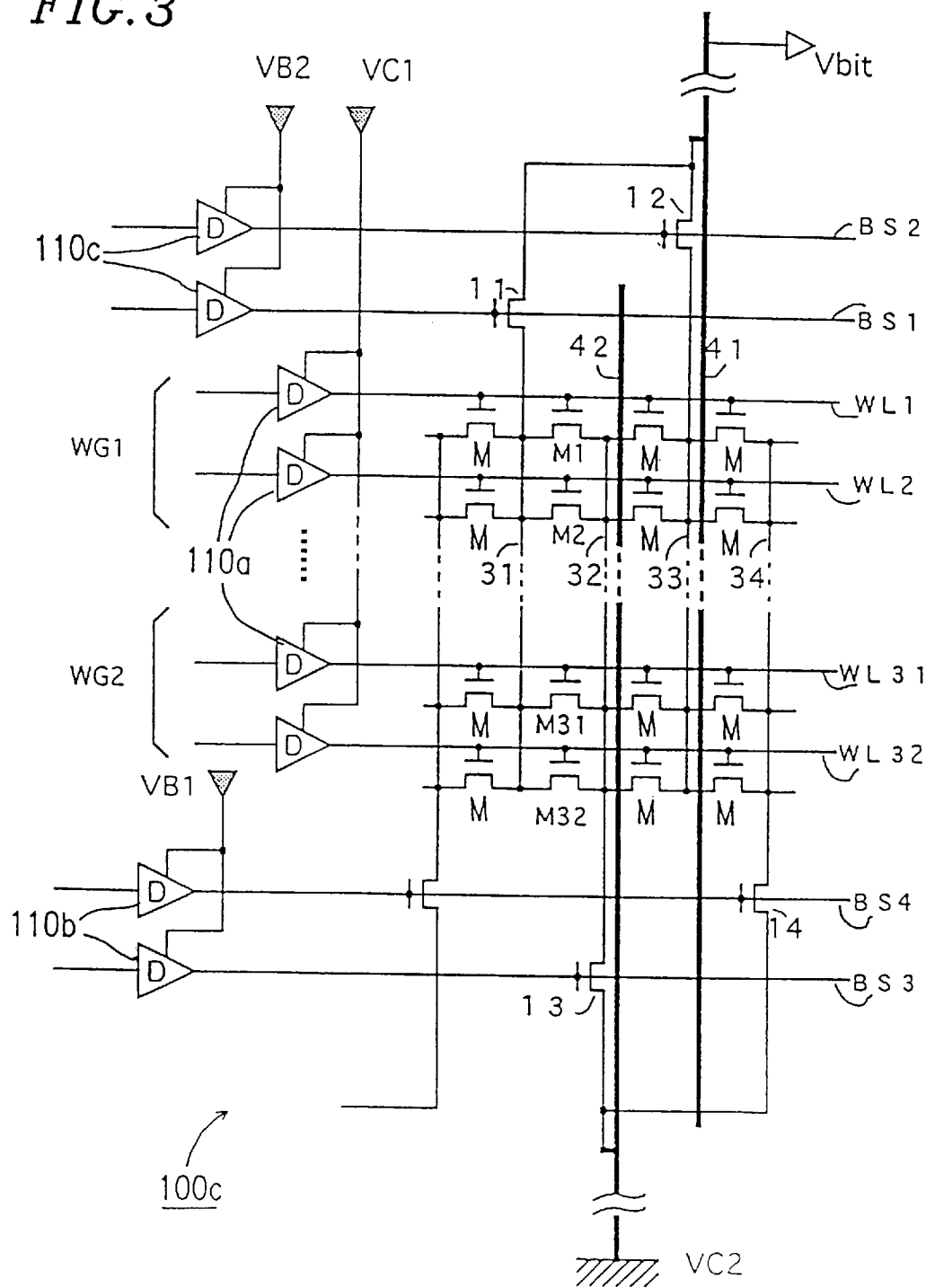
FIG. 3 is a circuit diagram illustrating a ROM using a bank system as a semiconductor storage device in a third example of the present invention, particularly showing a memory cell array and a part of the peripheral circuits thereof as the components of the ROM.

FIG. 3 is a circuit diagram illustrating a ROM using a bank system as a semiconductor storage device in a third example of the present invention. Particularly, it shows a memory cell array and a part of the peripheral circuits thereof as the components of the ROM.

In FIG. 3, the reference numeral 100c denotes a ROM using a bank system in the third example, and the same reference numerals as those used in FIG. 1 denote the same components as those of the ROM 100a in the first example.

In the third example, a plurality of word lines WL1 to WL32 are provided so as to correspond to the respective rows of the memory cells and divided into two word line groups WG1 and WG2. The potential to be applied as an ON potential for a bank Tr to the bank selection lines BS1 and BS2 on the drain side of the memory cells and to the bank selection lines BS3 and BS4 on the source side of the memory cells is varied depending upon whether the selected word line belongs to the word line group WG1 or the word line group WG2.

In this example, a word line group detector for detecting whether the selected word line belongs to the word line group WG1 or the word line group WG2 can be implemented, for example, by using a first OR circuit, to which a signal for selecting one of the word lines WL1 to WL16, i.e., the output of a row decoder is input, and a second OR circuit, to which a signal for selecting one of the word lines WL17 to WL32, i.e., the output of the row decoder is input.

Alternatively, the word line group detector can also be implemented by using the input of the row decoder i.e., an address signal instead of the output of the row decoder. More specifically, the circuit can be configured to detect that the selected word line belongs to the first word line group WG1 based on the upper bits of the address signal input to the row decoder and that the selected word line belongs to the second word line group WG2 based on the inverted signal of the upper bits.

In addition, in the third example, the power supply circuit 101 (see FIG. 6) for supplying the power potential VB2 to the drivers 110c of the bank selection lines BS1 and BS2 and the power supply circuit 101 for supplying the power potential VB1 to the drivers 110b of the bank selection lines BS3 and BS4, are respectively modified such that the voltage control circuit 110a of the power supply circuit 101 includes two serially connected resistances R1 and R2 and the two divided switches SB1 and SB2 corresponding to the resistances R1 and R2.

In the power supply circuit 101 for supplying the power potential VB2 to the drivers 110c of the bank selection lines BS1 and BS2, the control signals PD2 and PD1 for the divided switches SB1 and SB2 are made to correspond to the word line groups WG1 and WG2, respectively. For example, when a word line belonging to the word line group WG1 is selected, the divided switch SB2 is made conductive in accordance with the control signal PD2.

On the other hand, in the power supply circuit 101 for supplying the power potential VB1 to the drivers 110b of the bank selection lines BS3 and BS4, the control signals PD1 and PD2 are made to correspond to the word line groups WG1 and WG2, respectively. For example, when a word line belonging to the word line group WG1 is selected, the divided switch SB1 is made conductive in accordance with the control signal PD1.

In the ROM of the third example having such a configuration, the ON potential for a bank Tr to be applied to each of the bank selection line is switched depending upon whether the selected word line belongs to the first word line group or the second word line group. Consequently, it is possible to suppress the variation of the potential Vbit read out on the bit line depending upon the position of the selected memory cell by utilizing a simpler configuration than that of the first or the second example.

EXAMPLE 4

Figure 7:
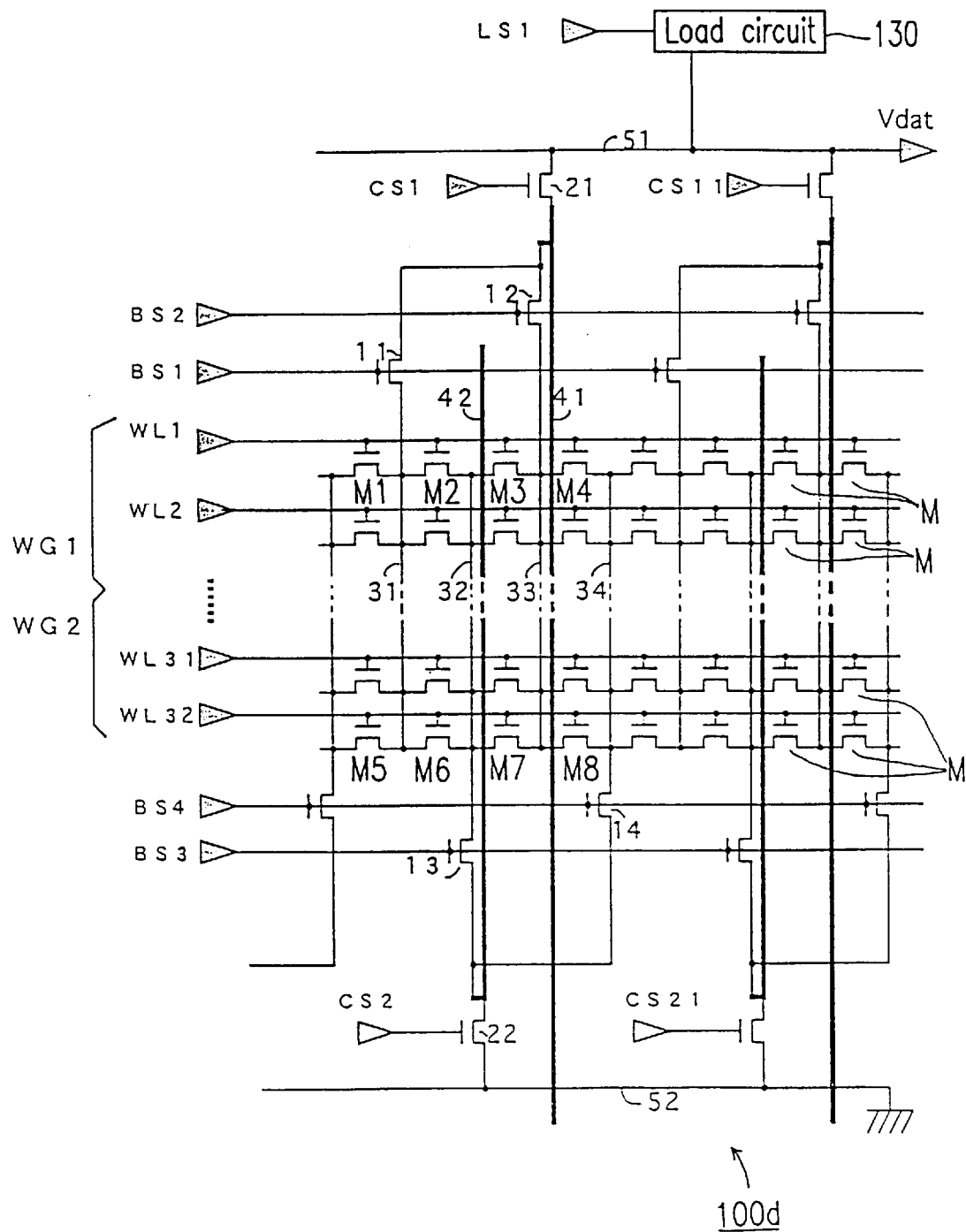
FIG. 7 is a circuit diagram illustrating a ROM using a bank system as a semiconductor storage device in a fourth example of the present invention.

FIG. 7 is a circuit diagram illustrating a ROM using a bank system as a semiconductor storage device in a fourth example of the present invention. Particularly, it shows a memory cell array and a part of the peripheral circuits thereof as the components of the ROM.

In FIG. 7, the reference numeral 100*d* denotes the ROM using a bank system in the fourth example. The ROM 100*d* includes a memory cell array formed by arranging in matrix memory cells M and M1 to M8, each of which is formed of a memory transistor, and a first main bit line 41 and a second main bit line 42 for reading out the information from the selected memory cell.

The first main bit line 41 is connected to a data line 51 via a column selection transistor 21, while the second main bit line 42 is connected to a ground line 52 via a column selection transistor 22. In the following description, the first main bit line 41 will be simply referred to as a "main bit line" and the second main bit line 42 will be simply referred to as a "main ground line".

The memory cell array of the ROM 100*d* is further provided with first sub-bit lines 31 and 33 and second sub-bit lines 32 and 34 so as to correspond to the respective columns of the memory cells. Each of the first sub-bit lines 31 and 33 functions as a common drain for the memory transistors forming the memory cells in the column corresponding to the first sub-bit line, while each of the second sub-bit lines 32 and 34 functions as a common source for the memory transistors forming the memory cells in the column corresponding to the second sub-bit line. In the following description, the first sub-bit lines 31 and 33 will be simply referred to as "sub-bit lines" and the second sub-bit lines 32 and 34 will be simply referred to as "sub-ground lines".

The sub-bit lines 31 and 33 are connected to the main bit line 41 via first bank selection transistors 11 and 12, respectively, for selecting a column of memory cells, while the sub-ground lines 32 and 34 are connected to the main ground line 42 via second bank selection transistors 13 and 14, respectively, for selecting a column of memory cells. Bank selection lines BS1 to BS4 are connected to the respective gates of the bank selection transistors 11 to 14. In this manner, two sub-bit lines are connected to one main bit line and two sub-ground lines are connected to one main ground line.

The memory cell array of the ROM 100*d* is further provided with a plurality of word lines WL1, WL2, . . . WL31 and WL32 so as to correspond to the respective rows of the memory cells and cross the sub-bit lines and the sub-ground lines. Each of the word lines is connected to the gates of the memory transistors forming the memory cells in the row corresponding to the word line. In this example, the plurality of word lines are divided into a first word line group WG1 consisting of the word lines WL1 to WL16 and a second word line group WG2 consisting of the word lines WL17 to WL32.

In the fourth example, a load circuit 130 configured such that the load characteristics thereof are variable in accordance with a predetermined switching signal LS1 connected to the data line 51. When a word line belonging to the first word line group WG1 is selected, the level of the switching signal LS1 is set to be high. On the other hand, when a word line belonging to the second word line group WG2 is selected, the level of the switching signal LS1 is set to be low.

Figure 15:
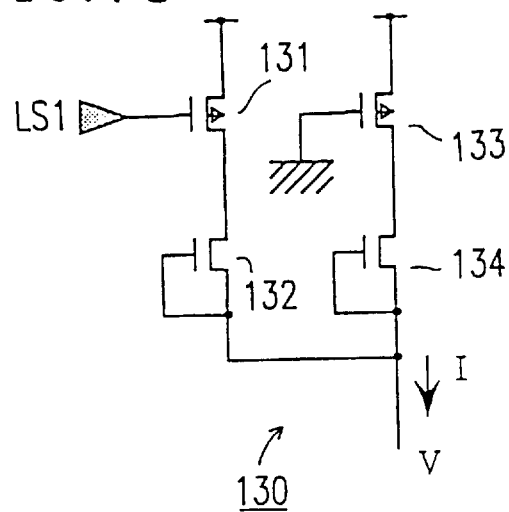
FIG. 15 is a diagram showing a specific circuit configuration for a load circuit as a component for the ROM in the fourth example.

FIG. 15 shows a specific circuit configuration for the load circuit 130. The load circuit 130 includes: a p-channel MOSFET 131 and an n-channel MOSFET 132 which are serially connected between a predetermined power potential and the data line 51; and a p-channel MOSFET 133 and an n-channel MOSFET 134 which are serially connected with each other and connected in parallel to the serially connected MOSFETs 131 and 132. In this example, the two n-channel MOSFETs 132 and 134 are in a diode connection; the gate of the p-channel MOSFET 133 is grounded; and the switching signal LS1 is applied to the gate of the p-channel MOSFET 131.

Figure 16:
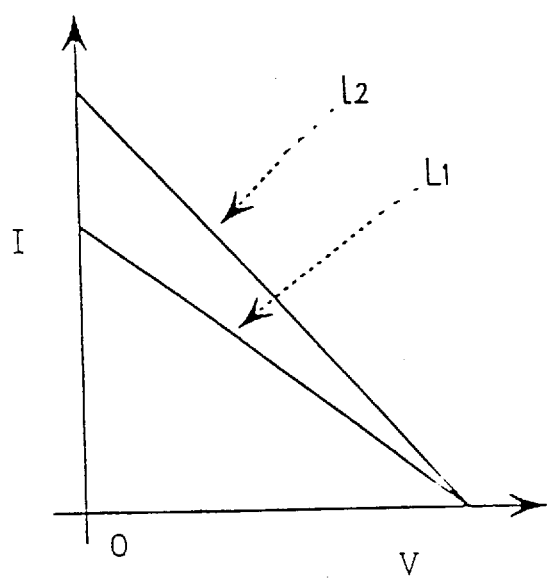
FIG. 16 is a graph showing the current-voltage (I–V) characteristics of the load circuit shown in FIG. 15.

FIG. 16 shows the current-voltage (I–V) characteristics of the load circuit 130 having such a configuration. When the switching signal LS1 is at a high level, the load circuit 130 exhibits the I–V characteristics represented by the graph $L_1$. On the other hand, when the switching signal LS1 is at a low level, the load circuit 130 exhibits the I–V characteristics represented by the graph $L_2$.

Figure 17:
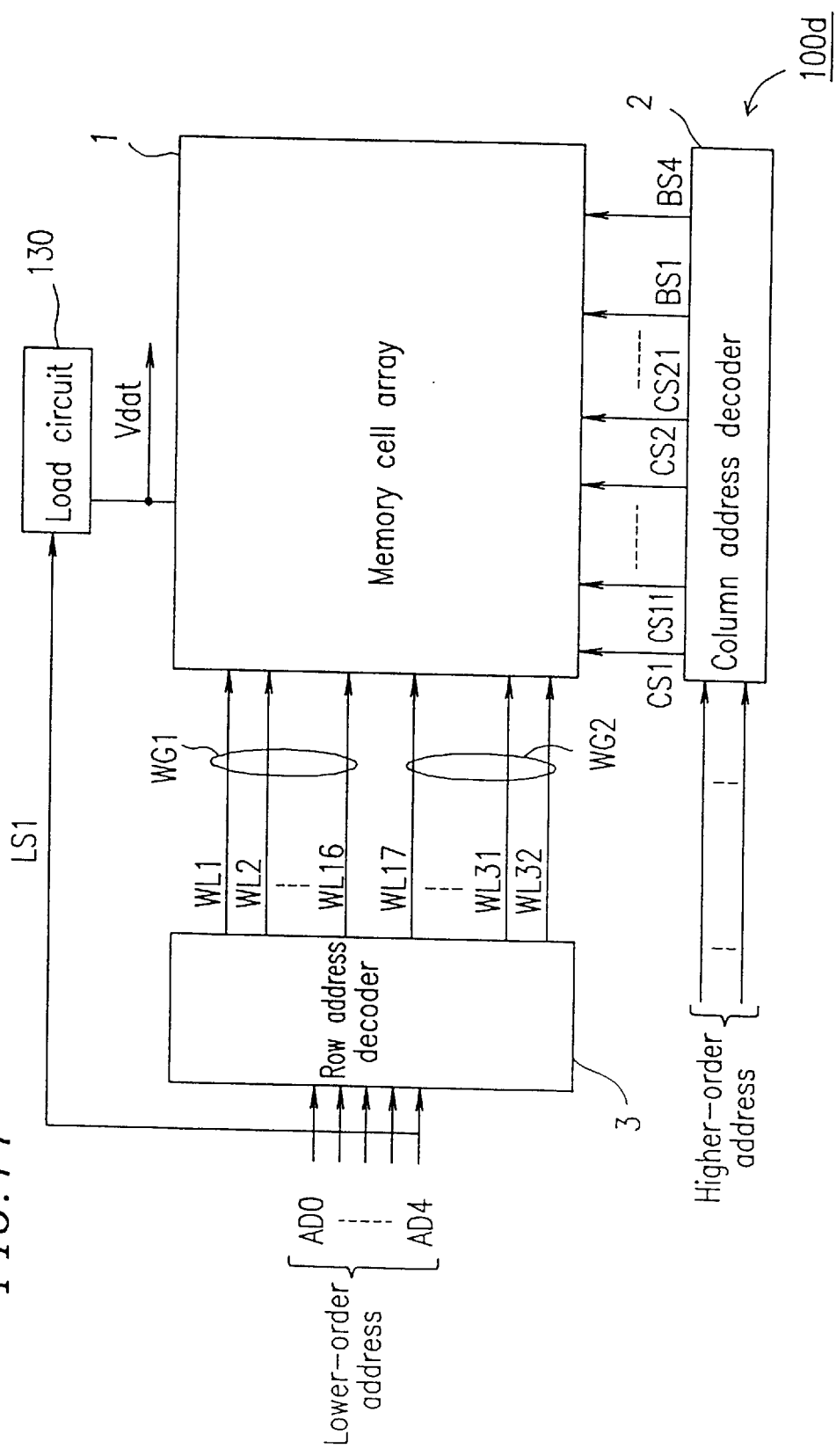
FIG. 17 is a block diagram illustrating a configuration for switching the characteristics of the load circuit of the ROM in the fourth example.

FIG. 17 is a block diagram illustrating a configuration for switching the characteristics of the load circuit 130 of the ROM 100*d* using a bank system in the fourth example. The ROM 100*d* includes: a memory cell array 1 having the above-described configuration; a column address decoder 2 for generating a signal for selecting one of the column selection lines CS1, CS11, etc., a signal for selecting one of the column selection lines CS2, CS21, etc., and a signal for selecting one of the bank selection lines BS1, BS4, etc., based on the input addresses; and a row address decoder 3 for selecting one of the word lines based on the input addresses AD0 to AD4.

In such a configuration, the switching signal LS1 for switching the load characteristics can be easily generated from the row address decoder 3. Thus, in the case where the word lines WL1 to WL32 are decoded based on the addresses AD0 to AD4 in this manner, the most significant address AD4 of these addresses can be supplied to the load circuit 130 as the switching signal LS1.

In this example, when a memory cell M2 is selected, for example, the signal levels of the bank selection lines BS1 to BS4 are: BS1=H, BS2=L, BS3=H and BS4=L; the signal levels of the column selection lines CS1 and CS2 are: CS1=H and CS2=H; and the signal level of the load switching signal LS1=L.

On the other hand, when a memory cell M3 is selected, the signal levels of the bank selection lines BS1 to BS4 are: BS1=L, BS2=H, BS3=H and BS4=L; the signal levels of the column selection lines CS1 and CS2 are: CS1=H and CS2=H; and the signal level of the load switching signal LS1=L.

Moreover, when a memory cell M6 is selected, the signal levels of the bank selection lines BS1 to BS4 are: BS1=H, BS2=L, BS3=H and BS4=L; the signal levels of the column selection lines CS1 and CS2 are: CS1=H and CS2=H; and the signal level of the load switching signal LS1=H.

Furthermore, when a memory cell M7 is selected, the signal levels of the bank selection lines BS1 to BS4 are: BS1=L, BS2=H, BS3=H and BS4=L; the signal levels of the column selection lines CS1 and CS2 are: CS1=H and CS2=H; and the signal level of the load switching signal LS1=H.

Next, functions or effects attainable in the fourth example will be described.

Figure 18:
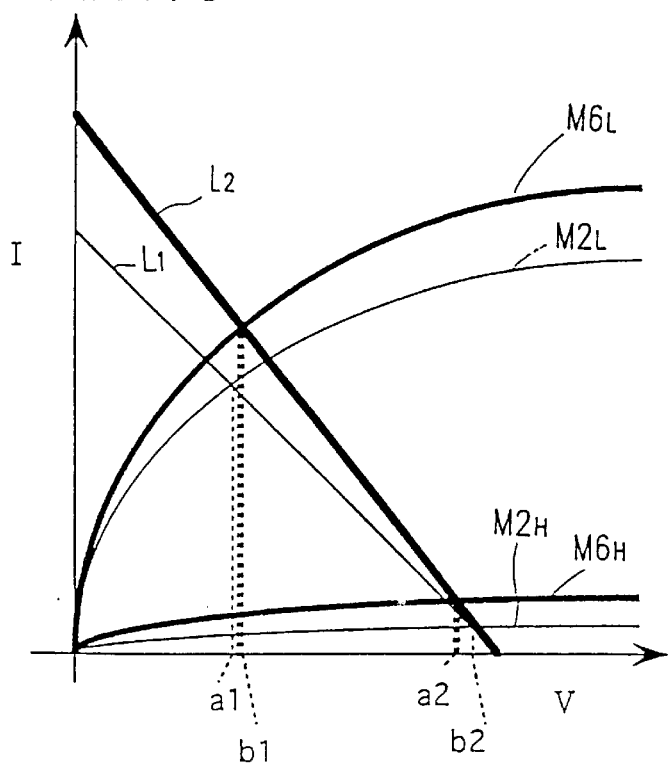
FIG. 18 is a graph illustrating the variation in the bit line potentials in the ROM in the fourth example.

Hereinafter, the bit line potential in the case of reading out the information from the memory cell M2 connected to the word line WL1 belonging to the first word line group WG1 will be compared with the bit line potential in the case of reading out the information from the memory cell M6 connected to the word line WL32 belonging to the second word line group WG2. FIG. 18 shows the I–V characteristics in the path of the current flowing from the load circuit 130 to the ground line 52 via the memory cells M2, etc. in such a case.

In the case of reading out the information from the memory cell M2, the I–V characteristics in the path of the current flowing from the load circuit 130 to the ground line 52 via the data line 51 and the memory cells M2, etc. are represented by the curve $M2_H$ when the threshold value of the memory cell M2 is high or by the curve $M^2L$ when the threshold value of the memory cell M2 is low.

On the other hand, in the case of reading out the information from the memory cell M6, the I–V characteristics in the path of the current flowing from the load circuit 130 to the ground line 52 via the data line 51 and the memory cells M6, etc. are represented by the curve $M6_H$ when the threshold value of the memory cell M6 is high or by the curve $M^6L$ when the threshold value of the memory cell M6 is low.

In the fourth example, the I–V characteristics of the load circuit 130 in the case of reading out the information from the memory cell M2 are represented by the graph $L_2$, while the I–V characteristics of the load circuit 130 in the case of reading out the information from the memory cell M6 are represented by the graph $L_1$.

Figure 22:
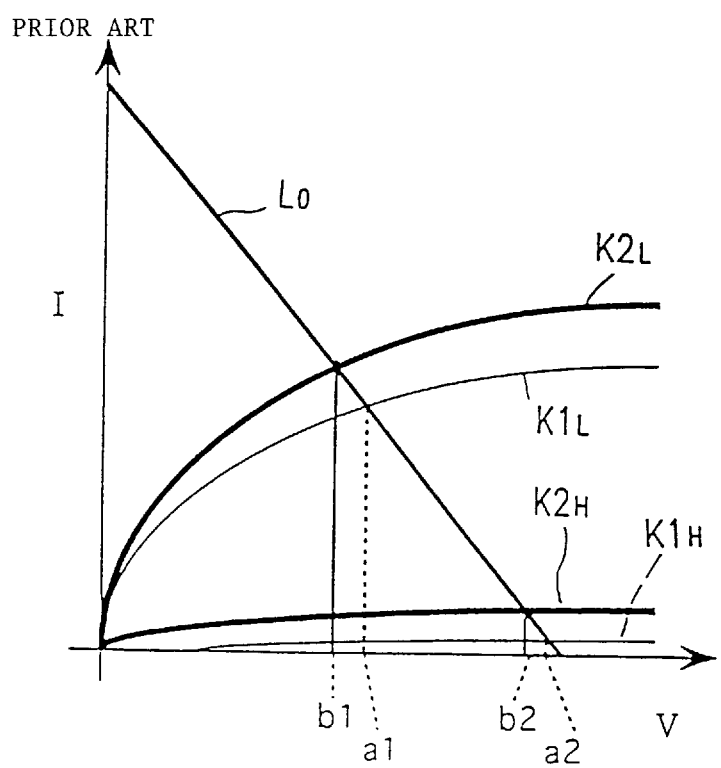
FIG. 22 is a graph illustrating the variation in the bit line potentials depending upon the position of a memory cell in a bank in a ROM according to a conventional bank system.
Figure 23:
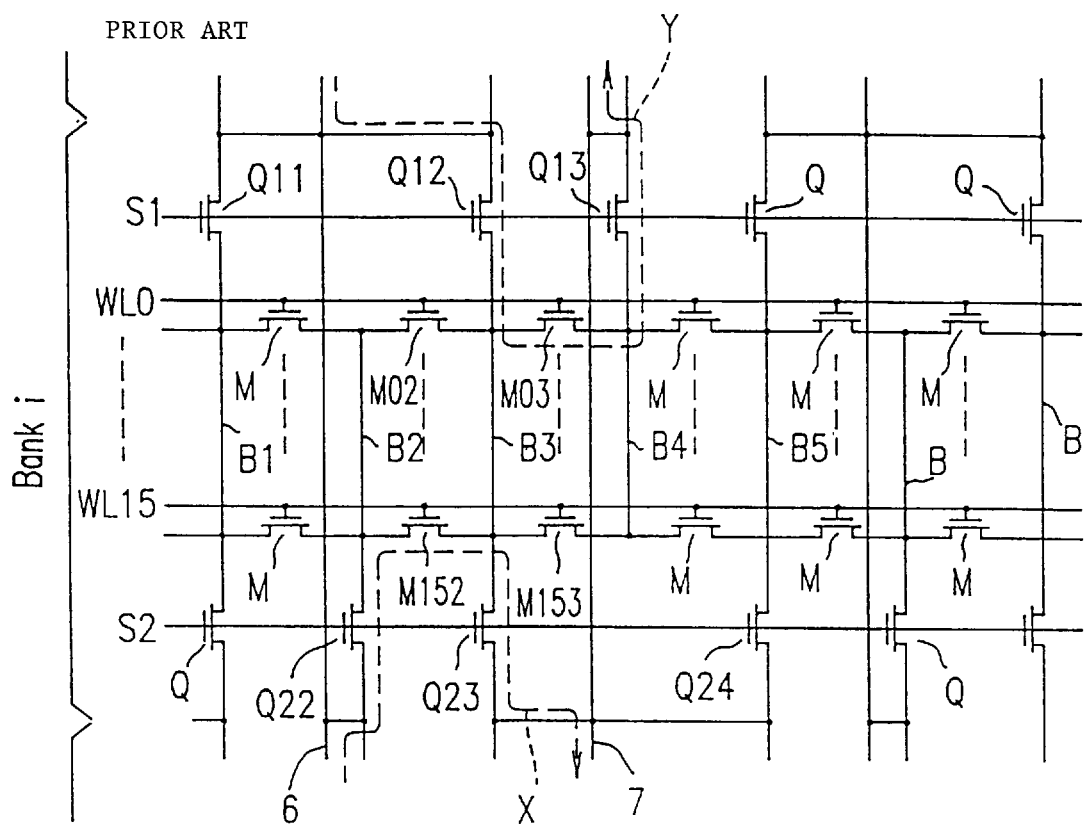
FIG. 23 is a circuit diagram showing a configuration for a ROM described in Japanese Laid-Open Patent Publication No. 5-167042.
Figure 24:
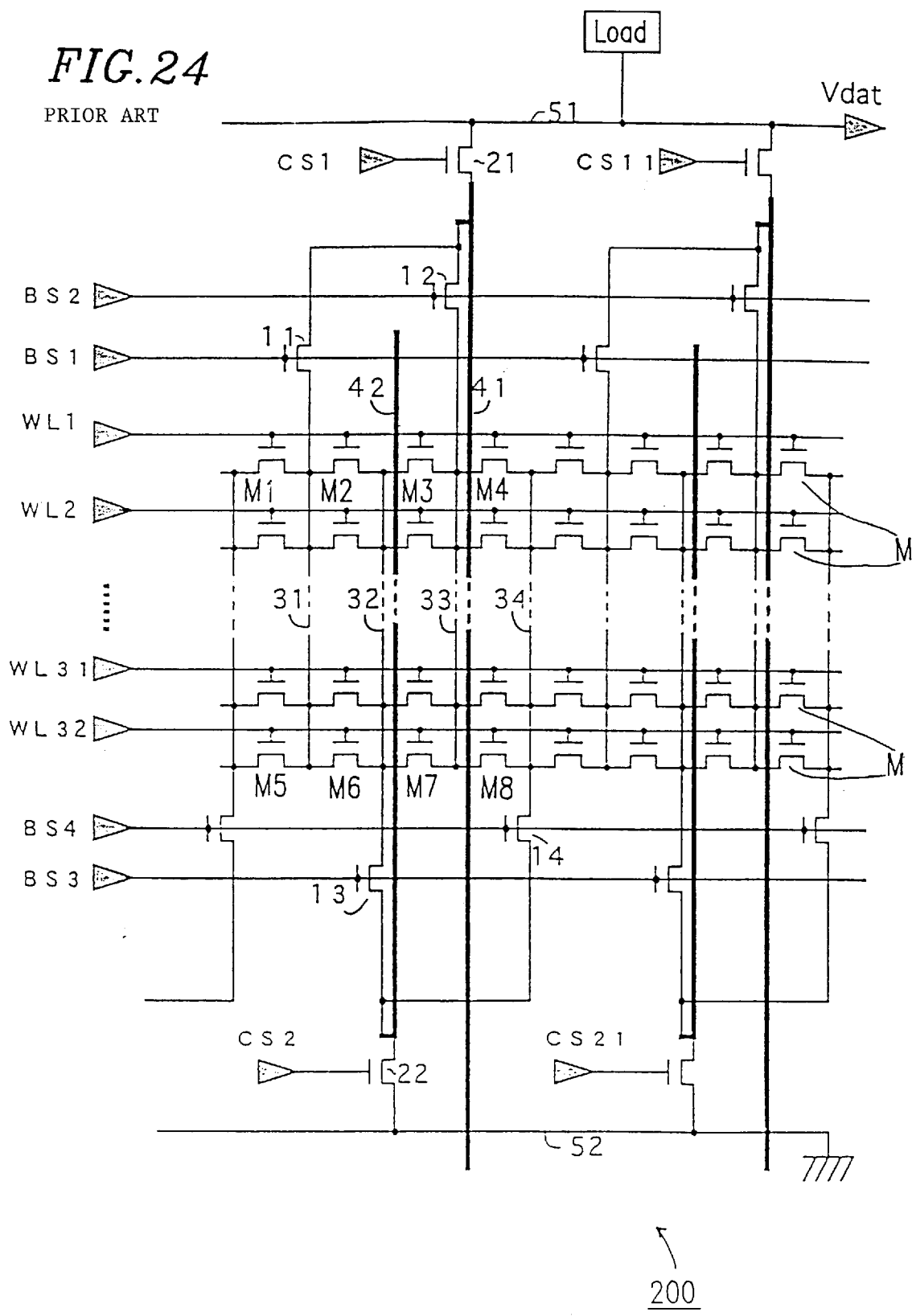
FIG. 24 is a circuit diagram showing an exemplary configuration for a memory cell array in a ROM according to a conventional bank system.
Figure 25:
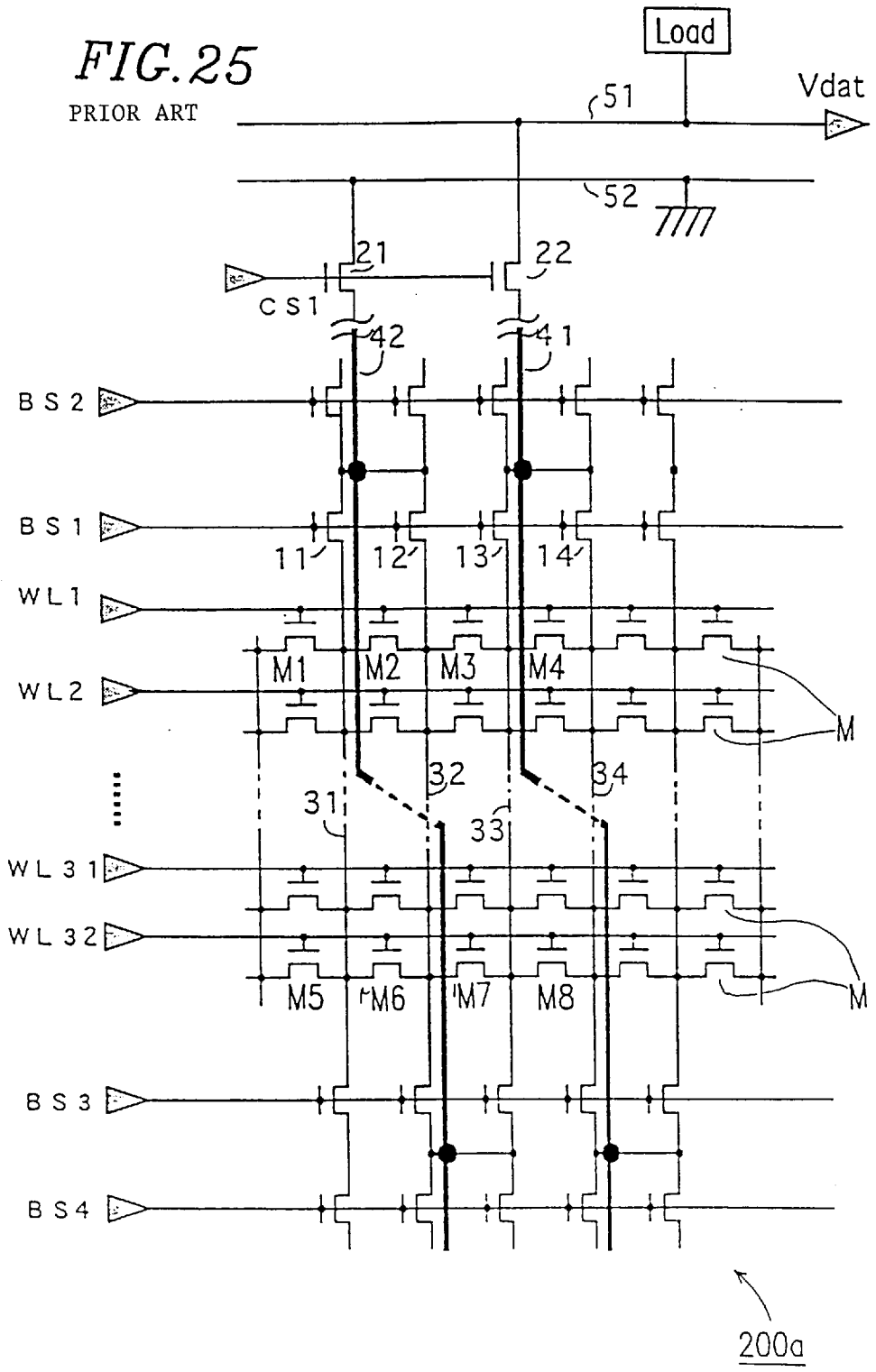
FIG. 25 is a circuit diagram showing another exemplary configuration for a memory cell array in a ROM according to a conventional bank system.

As is apparent from the comparison with a ROM according to a conventional bank system (see FIG. 22) in which the I–V characteristics of the load circuit are invariable irrespective of the position of the memory cell, from which information is read out, in a bank, the variation in the bit line potential depending upon the position of a memory cell in the bank becomes small. Thus, both a difference (a1–b1) between the bit line potentials when the threshold values of the memory cells M2 and M6 are low and a difference (a2–b2) between the bit line potentials when the threshold values of the memory cells M2 and M6 are high become smaller. Consequently, a margin between a bit line potential and a reference level can be increased.

In the fourth example, a plurality of word lines are divided into two word line groups, and the I–V characteristics of the load circuit 130 are switched depending upon whether the selected word line belongs to the first word line group or the second word line group. However, the number of word line groups is not limited to two. Alternatively, three or more word line groups can be provided. In the latter case, by setting the characteristics of the load circuit so as to correspond to each of the word line groups depending upon which word line group the selected word line belongs to, the variation in the bit line potential depending upon the position of a memory cell in a bank can be further reduced.

Figure 19:
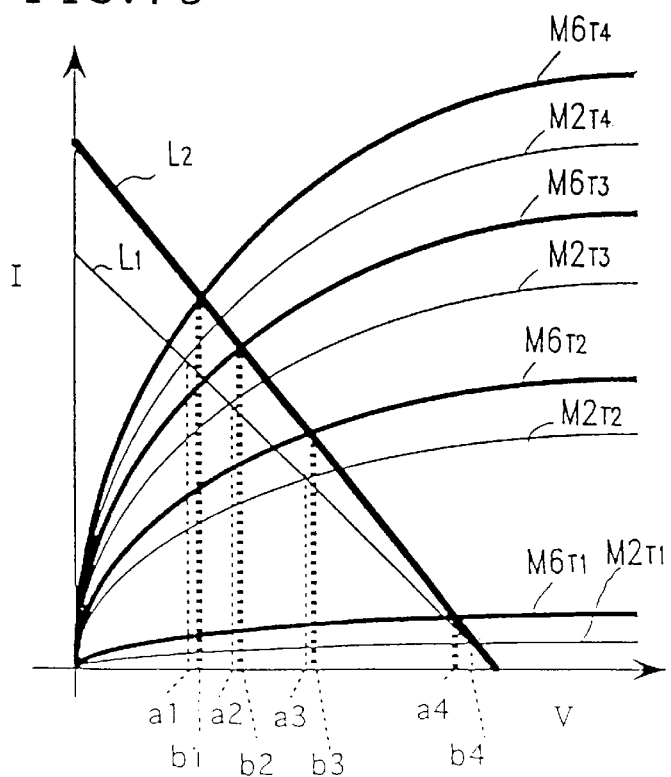
FIG. 19 is a graph illustrating the variation in bit line potentials in case where the ROM of the fourth example is a multivalent ROM.
Figure 20:
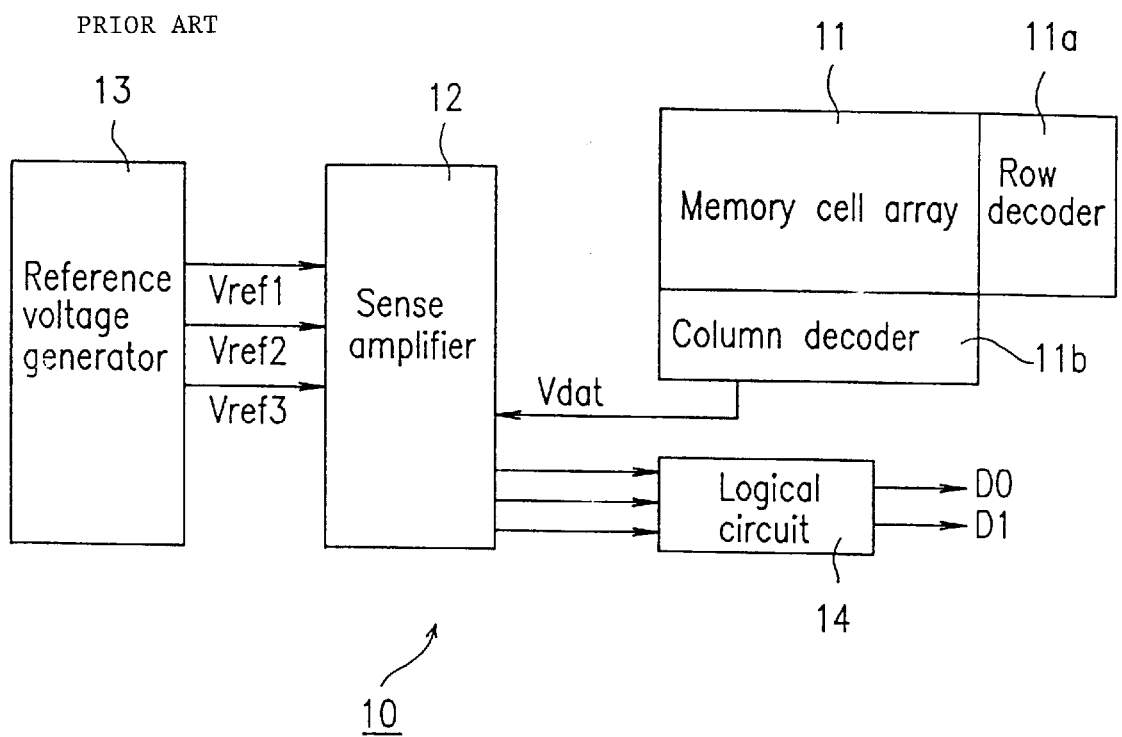
FIG. 20 is a block diagram showing a fundamental configuration for a conventional multivalent ROM.
Figure 21:
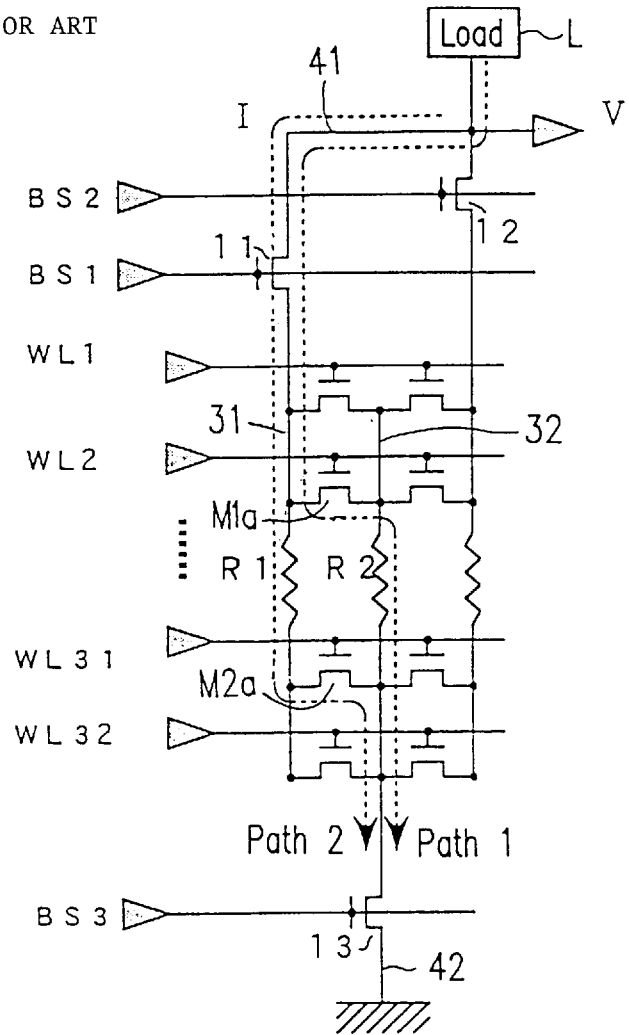
FIG. 21 is a diagram showing the paths of a current flowing when information is read out from the memory cells in a ROM according to a conventional bank system.

In the fourth example, a case where a memory cell as a component of the ROM has two threshold values has been described. Alternatively, a multivalent ROM in which a memory cell has three or more threshold values can also be used as the ROM. FIG. 19 shows the I–V characteristics in the first and the second current paths in the case where the ROM of the fourth example is replaced by a multivalent ROM where a memory cell has four threshold values T1 to T4. In FIG. 19, the curves $M2_{T1}$ to $M2_{T4}$ represent the I–V characteristics in the first current path in the case where the memory cell M2 has four threshold values T1 to T4, while the curves $M6_{T1}$ to $M6_{T4}$ represent the I–V characteristics in the second current path in the case where the memory cell M6 has four threshold values T1 to T4.

EXAMPLE 5

Figure 8:
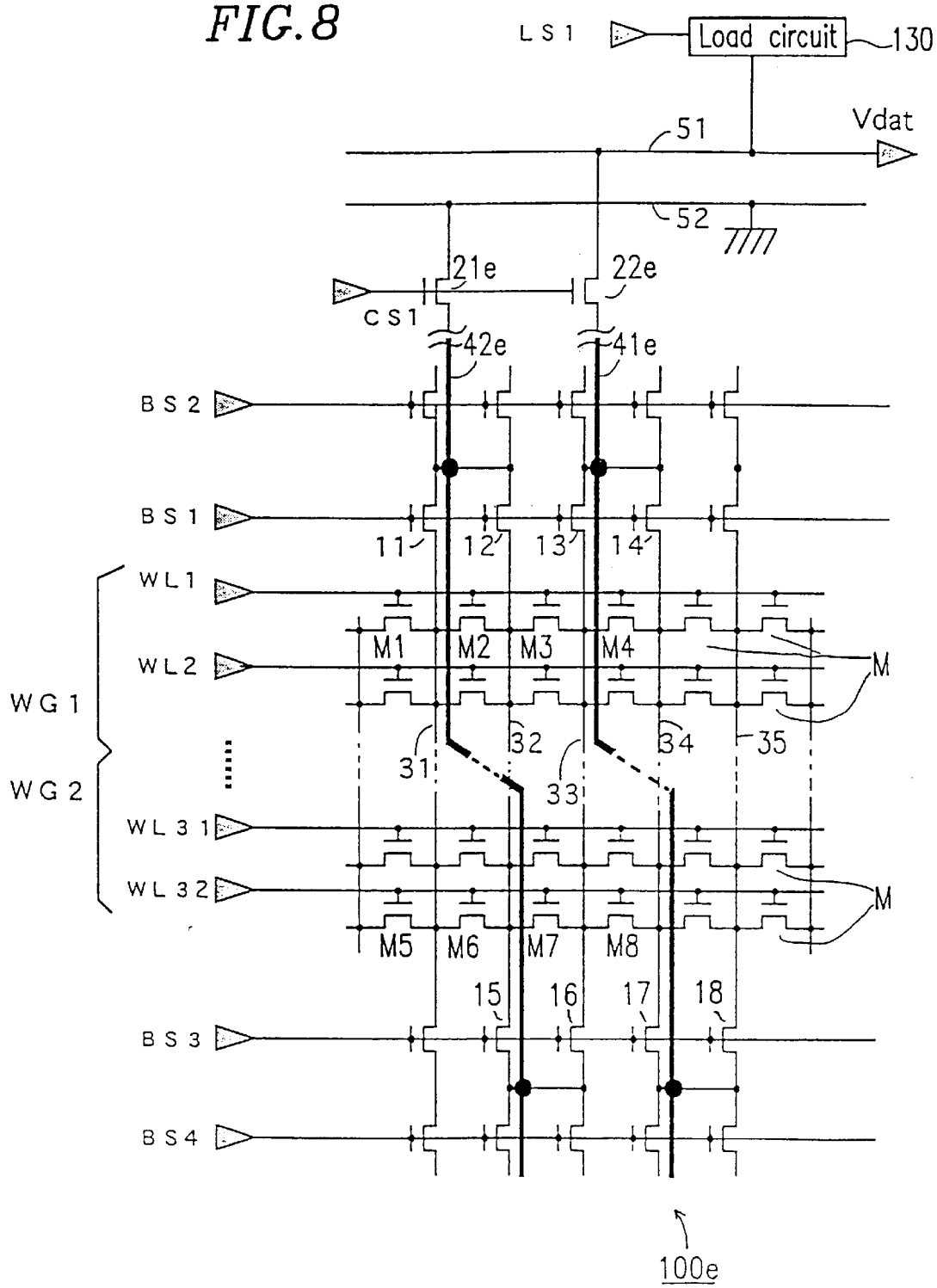
FIG. 8 is a circuit diagram illustrating a ROM using a bank system as a semiconductor storage device in a fifth example of the present invention.

FIG. 8 is a circuit diagram illustrating a ROM using a bank system as a semiconductor storage device in a fifth example of the present invention.

In FIG. 8, the reference numeral 100e denotes the ROM using a bank system in the fifth example. The same reference numerals as those used in FIG. 7 denote the same components as those of the ROM 100d in the fourth example.

In the fifth example, a data line 51 and a ground line 52 are disposed on the same side of the memory cell array. Two adjacent sub-bit lines 33 and 34 are connected to one main bit line 41e on one terminal side of the memory cell array via first bank Tr's 13 and 14, while two adjacent sub-bit lines 31 and 32 are connected to one main ground line 42e on one terminal side of the memory cell array via first bank Tr's 11 and 12. In this example, the gates of the bank Tr's 11 to 14 are connected to a bank selection line BS1. On the other hand, two adjacent sub-bit lines 34 and 35 are connected to the main bit line 41e on the other terminal side of the memory cell array via second bank Tr's 17 and 18, while two adjacent sub-bit lines 32 and 33 are connected to the main bit line 42e on the other terminal side of the memory cell array via second bank Tr's 15 and 16. In this example, the gates of the bank Tr's 15 to 18 are connected to a bank selection line BS3.

In addition, the main bit line 41e is connected to the data line 51 via a column Tr 22e; a load circuit 130 is connected to the data line 51; and the main ground line 42e is connected to the ground line 52 via a column Tr 21e.

The remaining configuration of the ROM 100e in the fifth example is the same as that of the ROM 100d in the fourth example.

In the ROM 100e having such a configuration, when a memory cell M3 is selected, for example, the signal levels of bank selection lines BS1 and BS3 are: BS1=H and BS3=L; the signal level of a column selection line CS1=H; and the signal level of a load switching signal LS1=H.

On the other hand, when a memory cell M4 is selected, the signal levels of the bank selection lines BS1 and BS3 are: BS1=L and BS3=H; the signal level of the column selection line CS1=H; and the signal level of the load switching signal LS1=L.

Moreover, when a memory cell M7 is selected, the signal levels of the bank selection lines BS1 and BS3 are: BS1=H and BS3=L; the signal level of the column selection line CS1=H; and the signal level of the load switching signal LS1=L.

Furthermore, when a memory cell M8 is selected, the signal levels of the bank selection lines BS1 and BS3 are: BS1=L and BS3=H; the signal level of the column selection line CS1=H; and the signal level of the load switching signal LS1=H.

EXAMPLE 6

Figure 9:
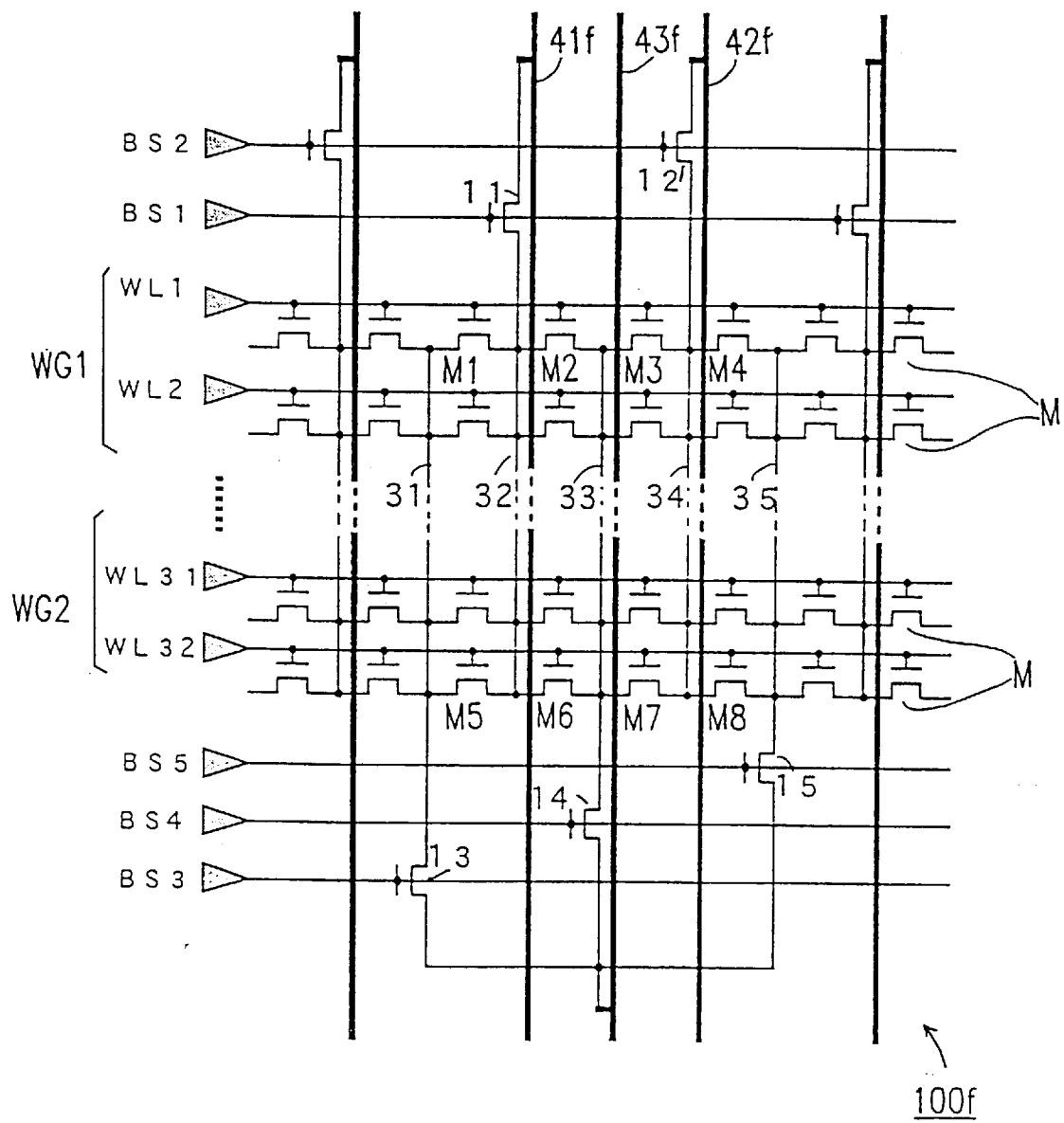
FIG. 9 is a circuit diagram illustrating a ROM using a bank system as a semiconductor storage device in a sixth example of the present invention.

FIG. 9 is a circuit diagram illustrating a ROM using a bank system as a semiconductor storage device in a sixth example of the present invention.

In FIG. 9, the reference numeral 100f denotes the ROM using a bank system in the sixth example. The same reference numerals as those used in FIG. 7 denote the same components as those of the ROM 100d in the fourth example. In the sixth example, a sub-bit line 32 is connected to a main bit line 41f via a bank Tr 11; a sub-bit line 34 is connected to a main bit line 42f via a bank Tr 12; and sub-ground lines 31, 33 and 35 are connected to a main ground line 43f via bank Tr's 13, 14 and 15.

It is noted that similar data line, ground line, column Tr's and load circuit to those used in the ROM 100d of the fourth example shown in FIG. 7 are also provided for the ROM 100f in the sixth example though not shown in FIG. 9.

In the ROM 100f having such a configuration, similar effects to those attained in the first example can also be attained.

EXAMPLE 7

Figure 10:
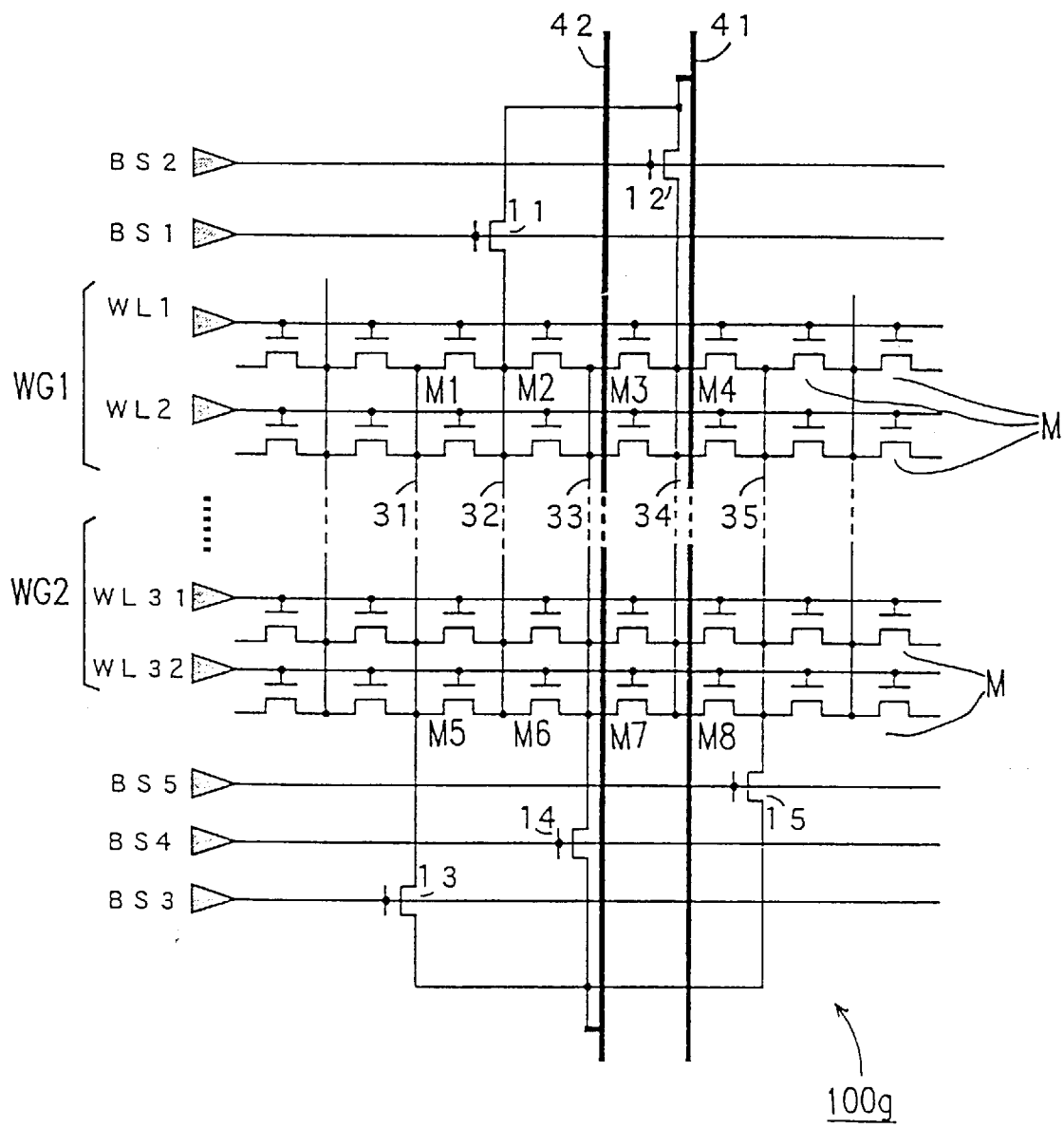
FIG. 10 is a circuit diagram illustrating a ROM using a bank system as a semiconductor storage device in a seventh example of the present invention.

FIG. 10 is a circuit diagram illustrating a ROM using a bank system as a semiconductor storage device in a seventh example of the present invention.

In FIG. 10, the reference numeral 100g denotes the ROM using a bank system in the seventh example. The same reference numerals as those used in FIG. 7 denote the same components as those of the ROM 100d in the fourth example. In the seventh example, sub-bit lines 32 and 34 are connected to a main bit line 41 via bank Tr's 11 and 12, while sub-ground lines 31, 33 and 35 are connected to a main ground line 42 via bank Tr's 13, 14 and 15.

It is noted that similar data line, ground line, column Tr's and load circuit to those used in the ROM 100d of the fourth example shown in FIG. 7 are also provided for the ROM 100g of the seventh example though not shown in FIG. 10.

In the seventh example, the number of sub-bit lines connected to the main bit line 41 is at most two per bank. As a result, the load capacitance of the main bit line can be reduced and a high-speed access is realized.

EXAMPLE 8

Figure 11A:
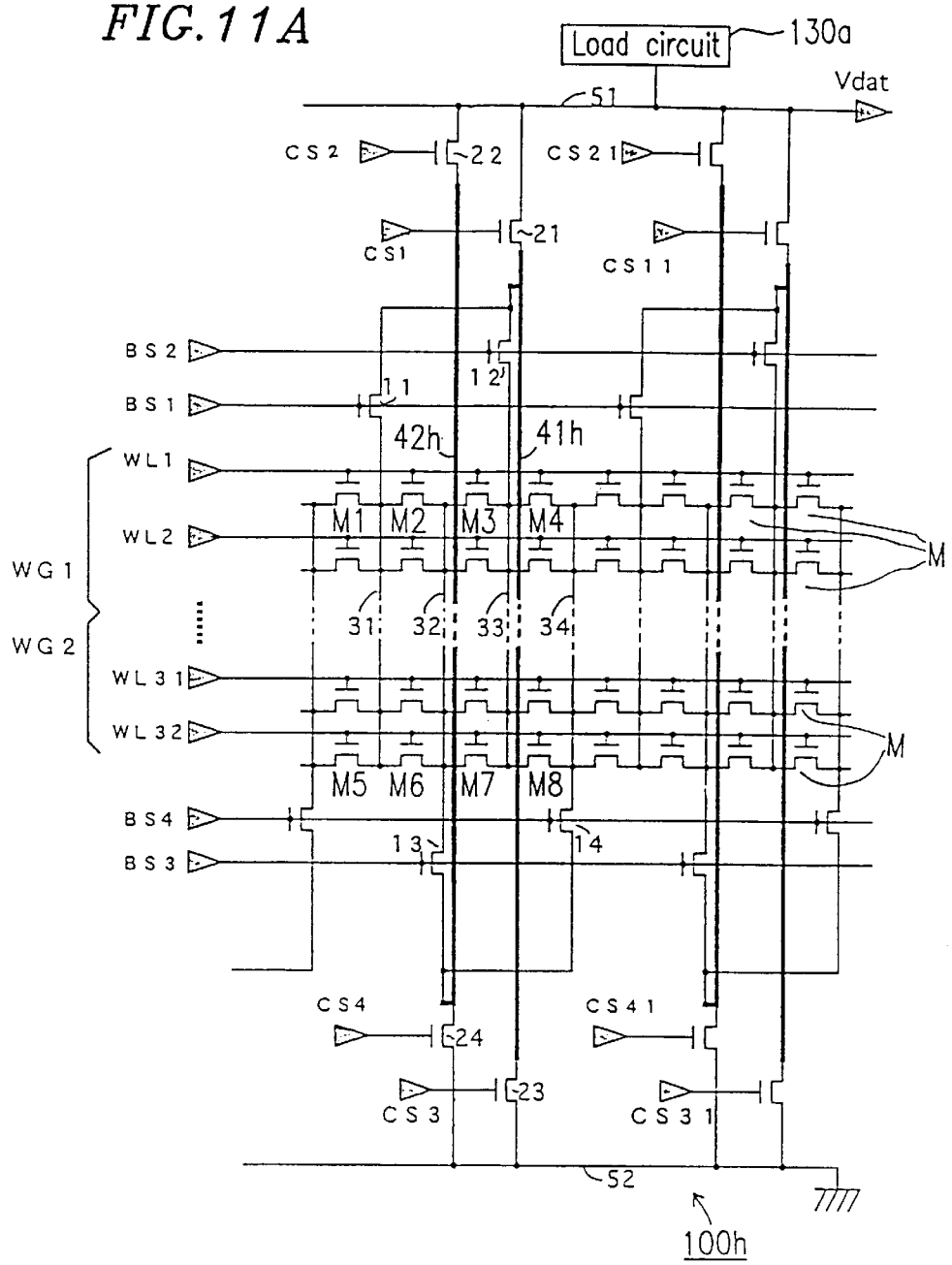
FIGS. 11A to 11C are diagrams illustrating a ROM using a bank system as a semiconductor storage device in an eighth example of the present invention. Particularly.

FIG. 11A is a circuit diagram illustrating a ROM using a bank system as a semiconductor storage device in an eighth example of the present invention.

In FIG. 11A, the reference numeral 100h denotes the ROM using a bank system in the eighth example. The same reference numerals as those used in FIG. 7 denote the same components as those of the ROM 100d in the fourth example.

In the eighth example, two sub-bit lines 31 and 33 are connected to one of a plurality of first main bit lines 41h via first bank Tr's 11 and 12, while two sub-bit lines 32 and 34 are connected to one of a plurality of second main bit lines 42h via bank Tr's 13 and 14. In this example, bank selection lines BS1 and BS2 are connected to the gates of the first bank Tr's 11 and 12, respectively, while bank selection lines BS3 and BS4 are connected to the gates of the second bank Tr's 13 and 14, respectively.

Each of the first main bit lines 41h is connected to a data line 51 via a corresponding first column Tr 21 and is also connected to a ground line 52 via a corresponding second column Tr 23. On the other hand, each of the second main bit lines 42h is connected to the data line 51 via a corresponding third column Tr 22 and is also connected to the ground line 52 via a corresponding fourth column Tr 24. In the eighth example, a load circuit 130a having invariable load characteristics is connected to the data line 51 unlike the fourth example.

A plurality of word lines WL1 to WL32 are provided on the memory cell array so as to cross the sub-bit lines 31 to 34. These word lines are divided into a first word line group WG1 consisting of the word lines WL1 to WL16 and a second word line group WG2 consisting of the word lines WL17 to WL32.

When a word line belonging to the first word line group WG1 is selected, the second column Tr 22 and the third column Tr 23 are selected, so that the second main bit line 42h is connected to the data line 51 and the first main bit line 41h is connected to the ground line 52. On the other hand, when a word line belonging to the second word line group WG2 is selected, the first column Tr 21 and the fourth column Tr 24 are selected, so that the first main bit line 41h is connected to the data line 51 and the second main bit line 42h is connected to the ground line 52.

As a result, it is possible to reduce the variation in the bit line potential caused by the difference between the resistance on the drain side of a memory transistor and the resistance on the source side thereof depending upon the position of the memory Tr in the bank to substantially the same level as that in a ROM where the number of word lines is 16.

Figure 11B:
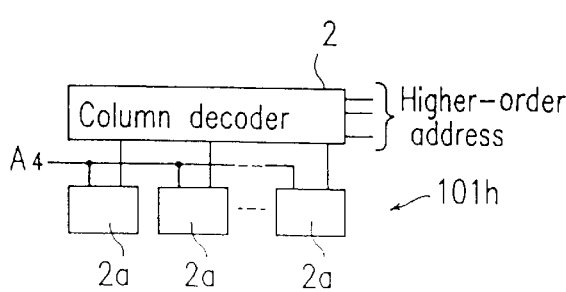
Figure 11C:
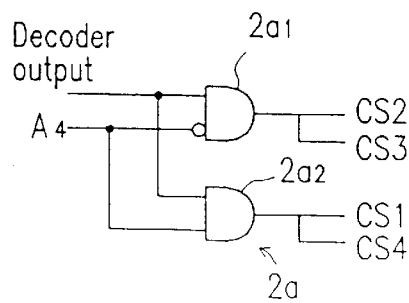

As shown in FIGS. 11B and 11C, a switching circuit for selecting one of the column Tr's 21, 22, 23 and 24 depending upon whether a selected word line belongs to the first word line group WG1 or the second word line group WG2 can be implemented by combining the output of a column address decoder 2 and the most significant address A4 of the addresses on the lower side. In this example, FIG. 11B shows a circuit configuration for such a switching circuit 101h. The switching circuit 101h includes: a column address decoder 2 for selecting a bank from the memory cell array in response to the upper-side address signals; and a plurality of sub-decoders 2a, each of which receives the output of the column address decoder 2 and the most significant address A4 of the lower-side addresses supplied to a row address decoder, thereby selecting a column Tr from a bank.

In addition, the sub-decoder 2a includes: a first AND circuit $2a_1$, receiving the inverted signal of the address A4 and the output of the decoder 2; and a second AND circuit $2a_2$ receiving the address A4 and the output of the decoder 2, as shown in FIG. 11C. The output of the first AND circuit $2a_1$ is connected to the column selection lines CS2 and CS3, while the output of the second AND circuit $2a_2$ is connected to the column selection lines CS1 and CS4.

In the eighth example, a state where the first main bit line 41h and the second main bit line 42h are electrically connected to the data line 51 and the ground line 52, respectively; or a state where the first main bit line 41h and the second main bit line 42h are electrically connected to the ground line 52 and the data line 51, respectively, is selected in such a manner depending upon which word line group the selected word line belong to. As a result, it is possible to suppress the variation in the bit line potential depending upon the position of a memory cell in a bank under a simplified configuration.

In the eighth example, the number of sub-bit lines connected to the first main bit line 41h is at most two per bank group (i.e., a group of memory cells corresponding to a pair of the first and the second main bit lines). As a result, the load capacitance of the main bit line can be reduced and a high-speed access is realized.

EXAMPLE 9

Figure 12A:
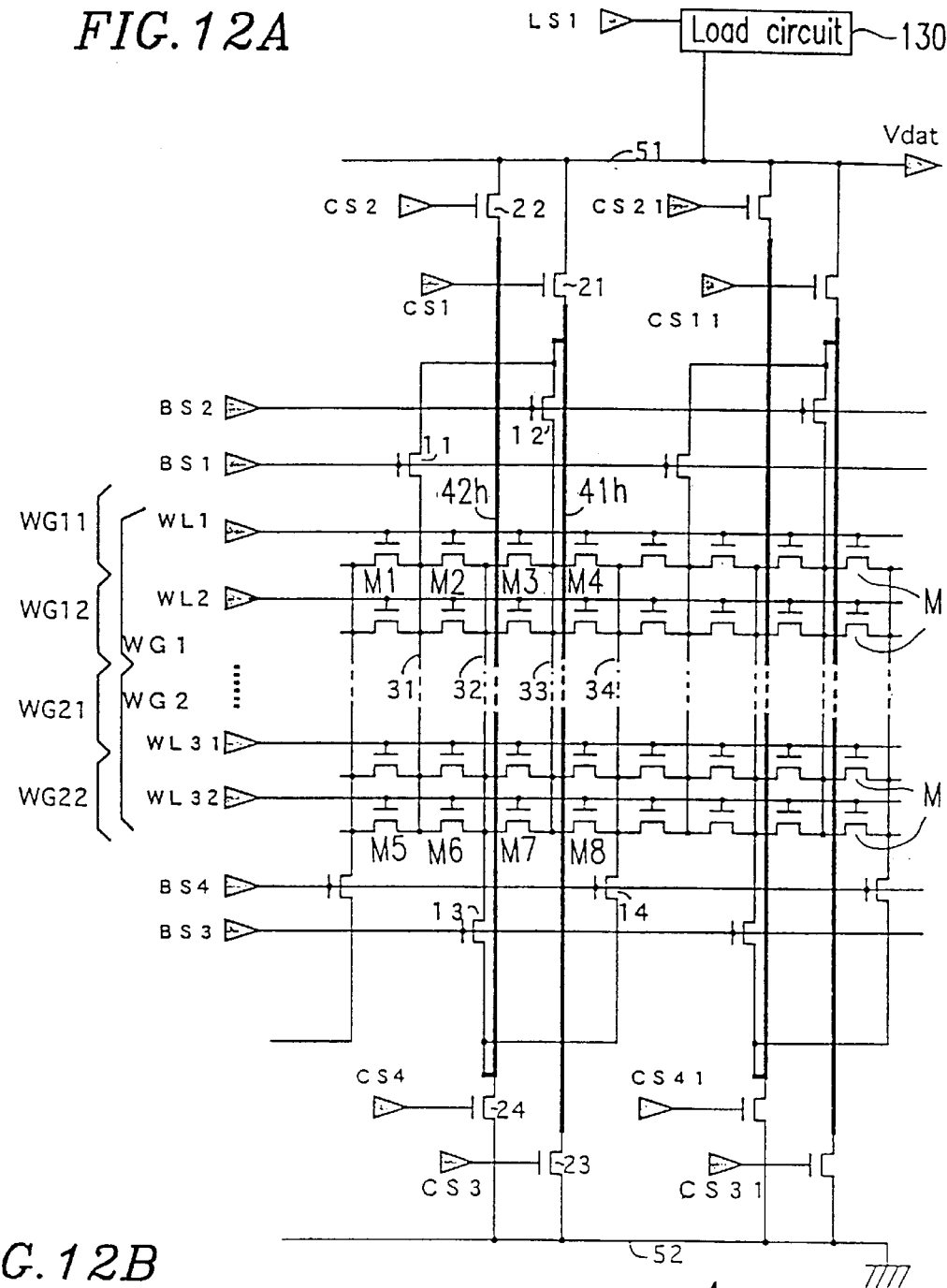
FIGS. 12A and 12B are diagrams illustrating a ROM using a bank system as a semiconductor storage device in a ninth example of the present invention. Particularly.

FIG. 12A is a circuit diagram illustrating a ROM using a bank system as a semiconductor storage device in a ninth example of the present invention.

In FIG. 12A, the reference numeral 100*i* denotes the ROM using a bank system in the ninth example. The same reference numerals as those used in FIG. 11A denote the same components as those of the ROM 100*h* in the eighth example.

In the ninth example, the first word line group WG1 of the ROM 100*h* in the eighth example is further divided into two word line sub-groups WG11 and WG12 and the second word line group WG2 is further divided into two word line sub-groups WG21 and WG22. In this example, the word lines WL1 to WL8 belong to the word line sub-group WG11; the word lines WL9 to WL16 belong to the word line sub-group WG12; the word lines WL17 to WL24 belong to the word line sub-group WG21; and the word lines WL25 to WL32 belong to the word line sub-group WG22. In addition, a load circuit 130, shown in FIG. 15, which can vary the load characteristics thereof in accordance with a switching signal LS1 is connected to a data line in the same way as in the fourth example.

Moreover, the ROM 100*i* of the ninth example has not only a similar configuration to that of the eighth example for selecting the connection between each main bit line and the data line or the connection between each main bit line and the ground line depending upon the word line group to which the selected word line belongs, but also a configuration for setting the switching signal LS1 at a high level when a word line belonging to the word line sub-group WG11 or WG22 is selected and for setting the switching signal LS1 at a low level when a word line belonging to the word line sub-group WG21 or WG12 is selected.

Figure 12B:
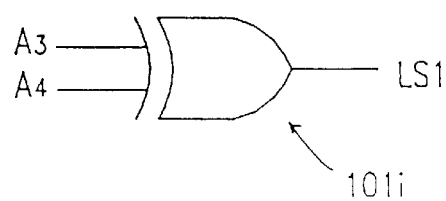

In this example, as shown in FIG. 12B, the circuit configuration for generating the switching signal LS1 is realized by using an exclusive-OR (EX-OR) circuit 101*i* for calculating an exclusive-OR of the most significant bit A4 of the row addresses and the second most significant bit A3 of the row addresses. Thus, when the address signal A3 is equal to the address signal A4, the switching signal LS1=H.

In the ROM 100*i* of the ninth example having such a configuration, the connection between each main bit line and the data line or the connection between each main bit line and the ground line is selected depending upon the word line group to which the selected word line belongs, and the characteristics of the load circuit 130 are switched depending upon the word line sub-group to which the selected word line belongs. As a result, it is possible to further suppress the variation in the bit line potential depending upon the position of a memory cell in the bank to which the memory cell belongs.

EXAMPLE 10

Figure 13:
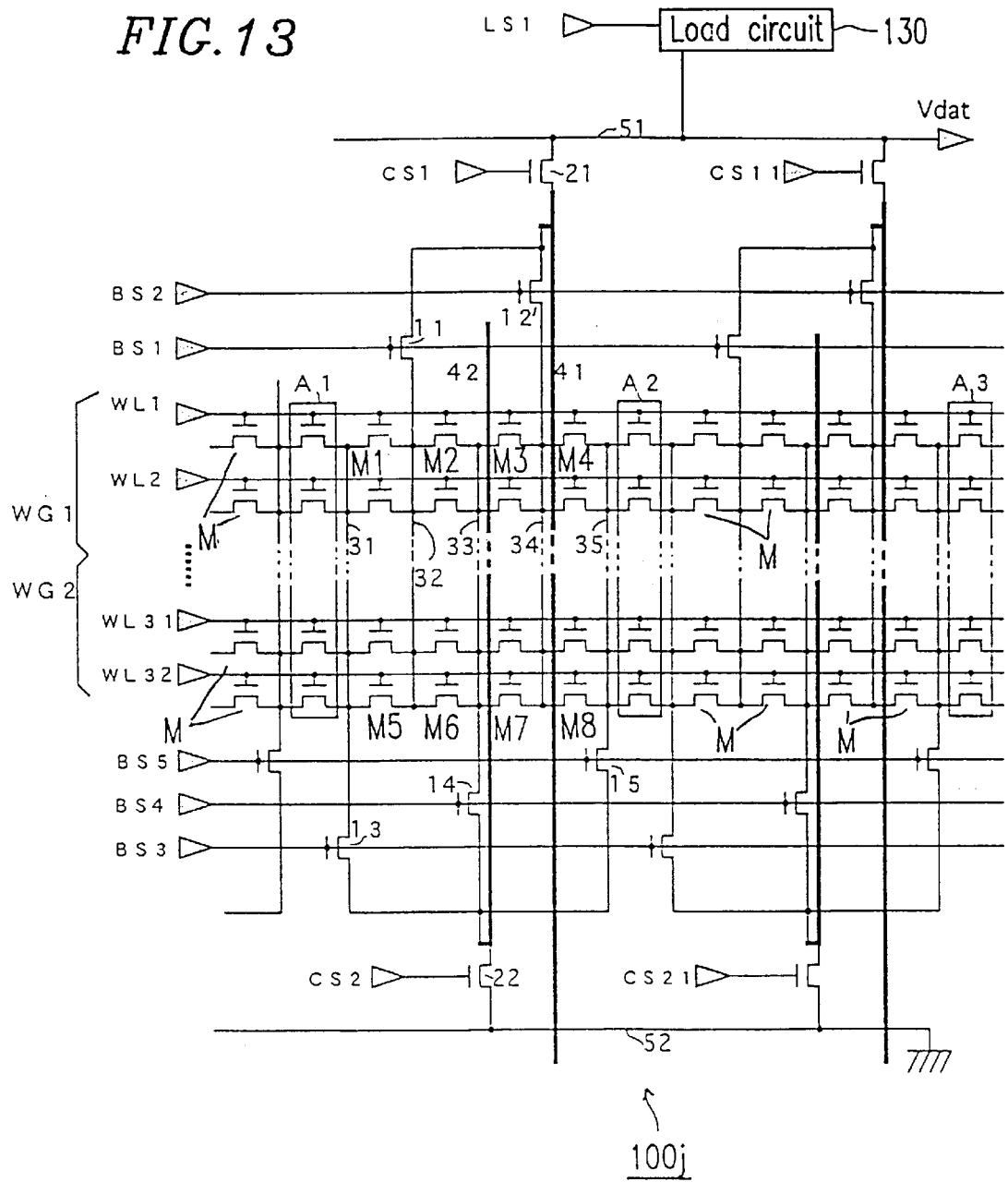
FIG. 13 is a circuit diagram illustrating a ROM using a bank system as a semiconductor storage device in a tenth example of the present invention.

FIG. 13 is a circuit diagram illustrating a ROM using a bank system as a semiconductor storage device in a tenth example of the present invention.

In FIG. 13, the reference numeral 100*j* denotes the ROM using a bank system in the tenth example. In the tenth example, element isolation regions A1, A2 and A3 are provided for the respective bank groups of the ROM 100*g* of the seventh example shown in FIG. 10, in which each bank group includes four banks (or four columns of memory cells) corresponding to five sub-bit lines 31 to 35.

Figure 14:
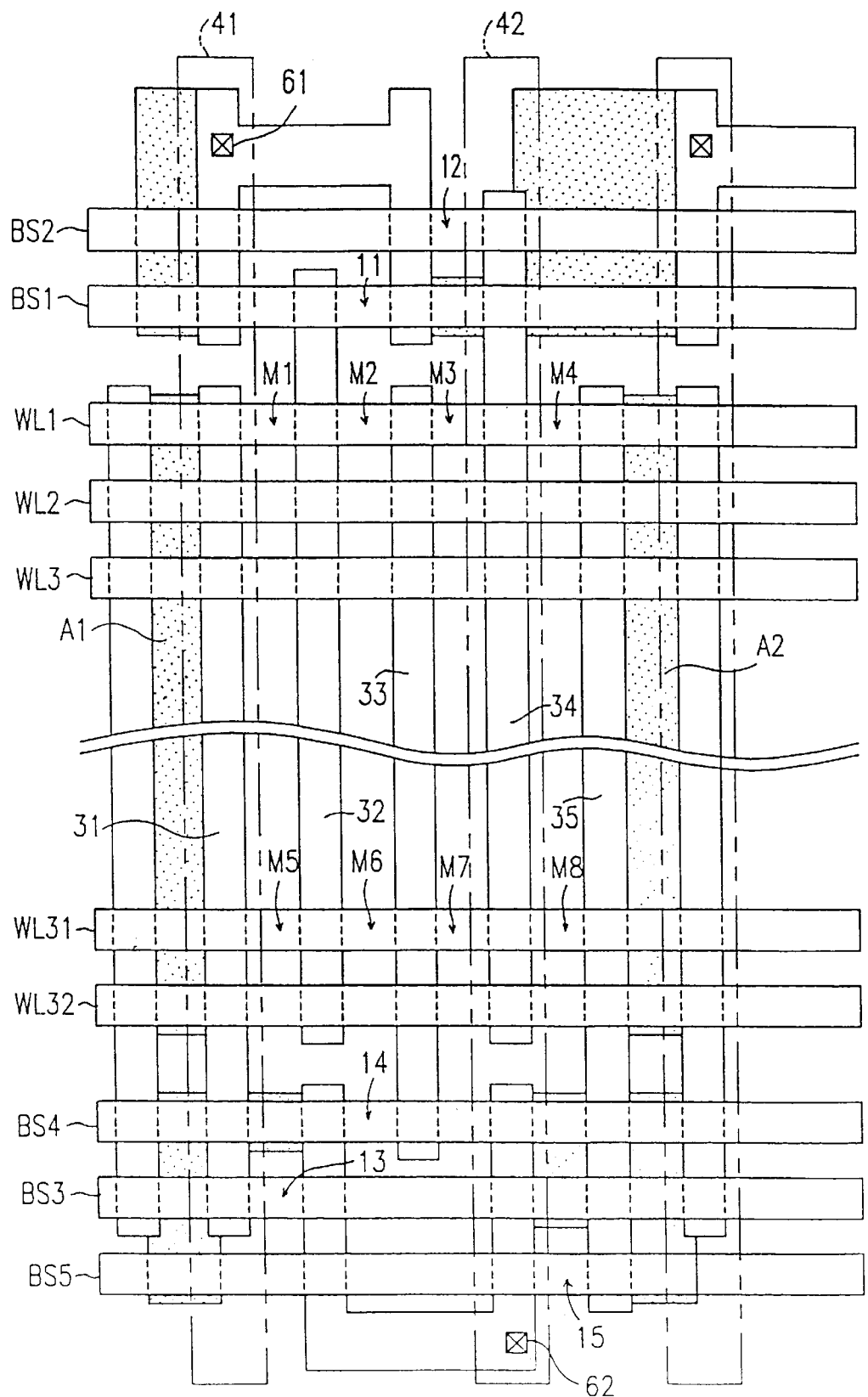
FIG. 14 is a plan view showing a configuration for a memory cell array as a component for the ROM in the tenth example.

FIG. 14 is a plan view showing a structure for the memory cell array as a component of the ROM 100*j* in the tenth example. The pattern formed by the respective wiring layers on a semiconductor substrate is shown in FIG. 14.

In this example, the main bit line 41 and the main ground line 42 are formed of aluminum layers, while the sub-bit lines 32 and 34 and the sub-ground lines 31, 33 and 35 are formed of $N^+$-diffusion layers formed in the surface region of the semiconductor substrate. The word lines WL1 to WL32 and the bank selection lines BS1 to BS5 are formed of poly-silicon layers or the like. The aluminum layer forming the main bit line 41 is connected to the $N^+$-diffusion layers forming the sub-bit lines 32 and 34 via a contact hole 61, while the aluminum layer forming the main ground line 42 is connected to the $N^+$-diffusion layers forming the sub-ground lines 31, 33 and 35 via a contact hole 62.

The formation of the element isolation regions A1 and A2 as well as the setting of the threshold voltages of the memory cells M1 to M8, etc. are accomplished by changing the dose of ions to be implanted for controlling the threshold values.

In the ROM 100*j* of the tenth example having such a configuration, the effects of the seventh example can also be attained. In addition, the electrical isolation among the bank groups and the elimination of an interference (e.g., a leakage current) from other bank groups are realized. As a result, it is possible to read out the information from the memory cells more stably.

In the tenth example, it is assumed that a memory transistor has two threshold values. In a multivalent ROM in which a memory transistor has three or more threshold values, by setting one of the threshold voltages of a memory transistor to be equal to the threshold voltage of a memory transistor for isolating the elements, the fabrication process steps for setting the threshold value of the memory transistor or the process steps for fabricating the element isolation regions can be simplified.

EXAMPLE 11

Figure 26:
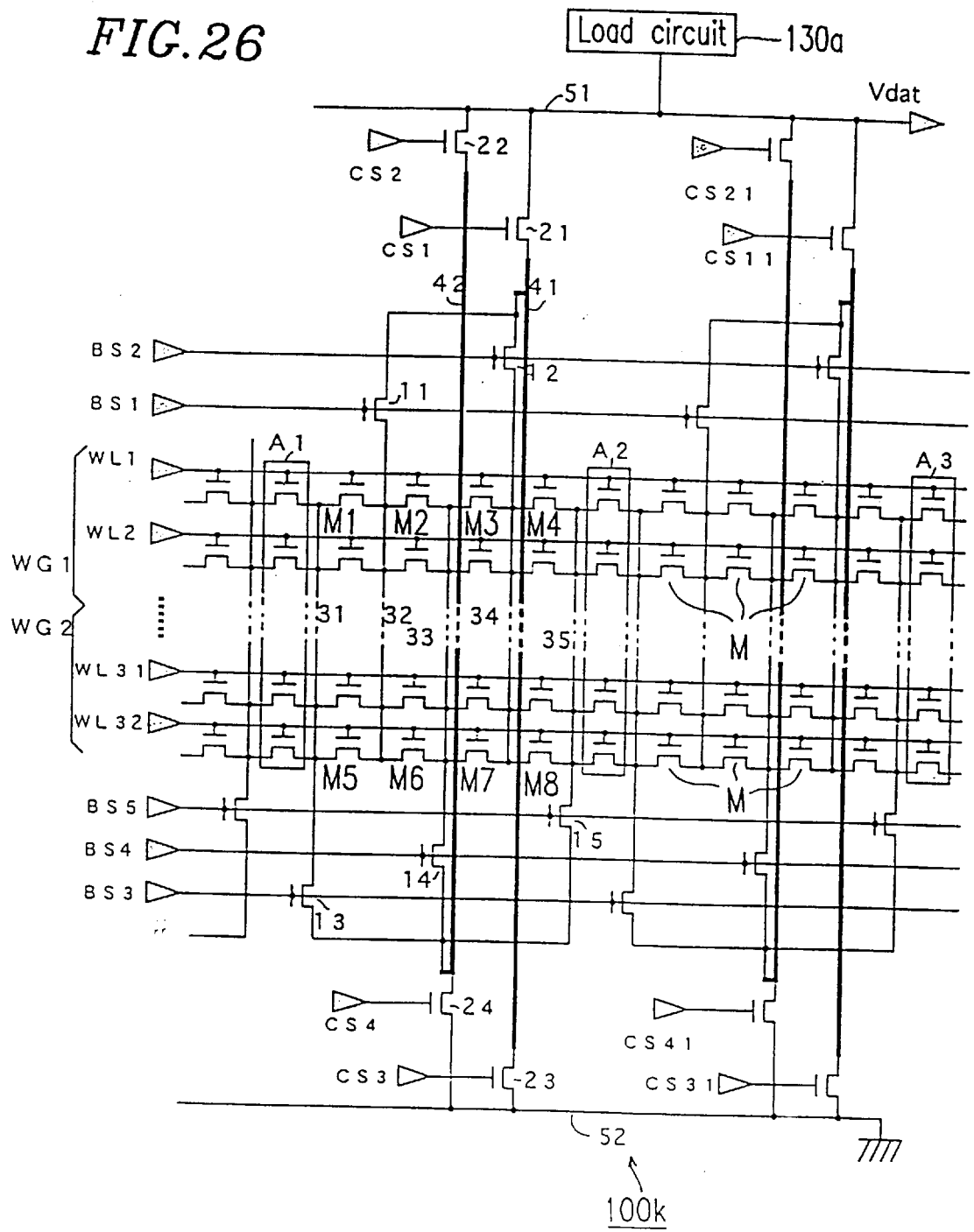
FIG. 26 is a circuit diagram illustrating a ROM using a bank system as a semiconductor storage device in an eleventh example of the present invention.

FIG. 26 is a circuit diagram illustrating a ROM using a bank system as a semiconductor storage device in an eleventh example of the present invention.

In FIG. 26, the reference numeral 100*k* denotes the ROM using a bank system in the eleventh example. In the eleventh example, element isolation regions A1, A2 and A3 are provided for the respective bank groups of the ROM 100*h* of the eighth example shown in FIGS. 11A, 11B and 11C, in which each bank group includes four banks corresponding to five sub-bit lines 31 to 35. The remaining configuration of the ROM 100*k* of the eleventh example is the same as that of the ROM 100*h* of the eighth example.

In the ROM 100*k* of the eleventh example having such a configuration, the effects of the eighth example can also be attained. In addition, the electrical isolation among the bank groups and the elimination of an interference (e.g., a leakage current) from other bank groups are realized. As a result, it is possible to read out the information from the memory cells more stably.

EXAMPLE 12

Figure 27:
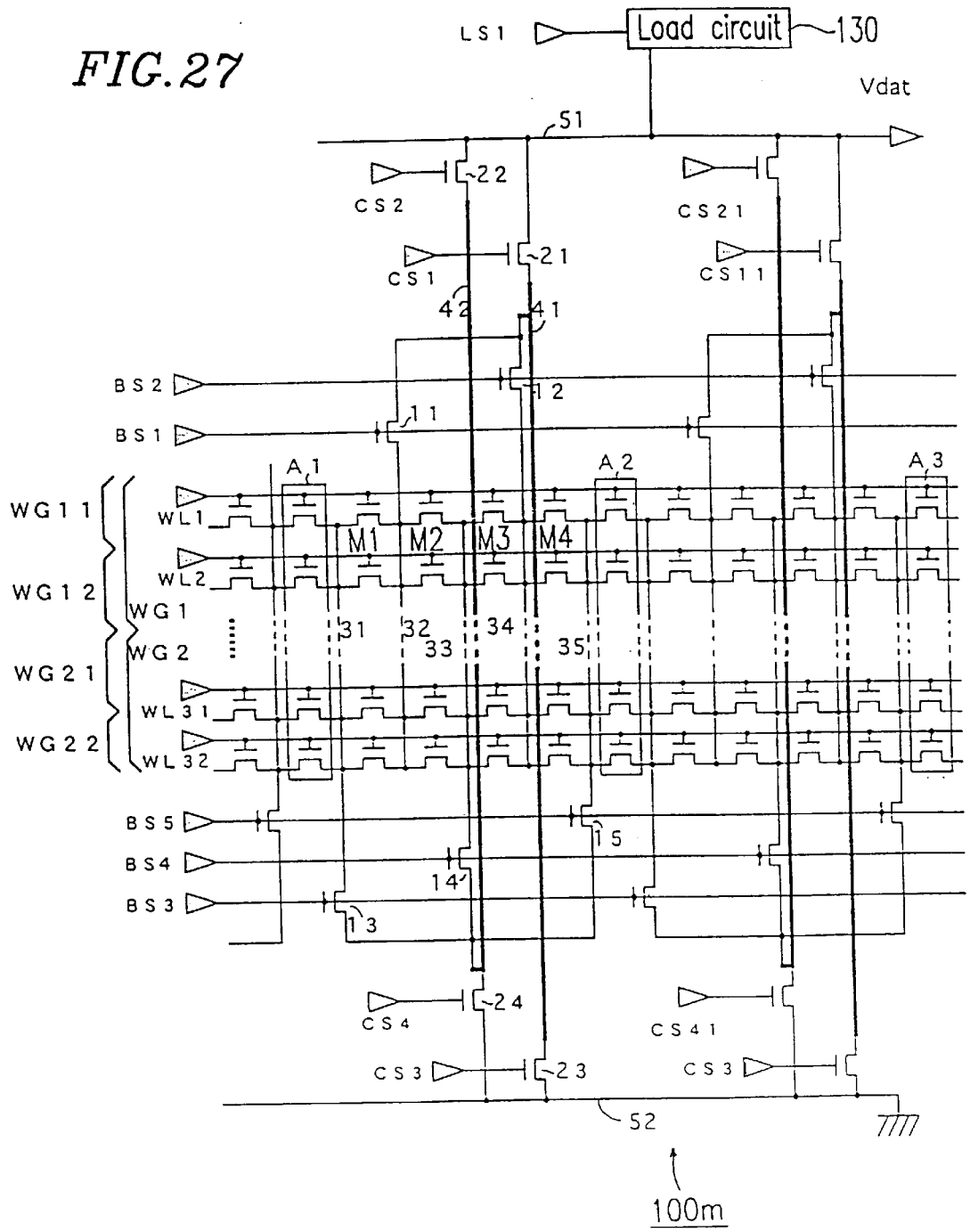
FIG. 27 is a circuit diagram illustrating a ROM using a bank system as a semiconductor storage device in a twelfth example of the present invention.

FIG. 27 is a circuit diagram illustrating a ROM using a bank system as a semiconductor storage device in a twelfth example of the present invention.

In FIG. 27, the reference numeral 100*m* denotes the ROM using a bank system in the twelfth example. In the twelfth example, element isolation regions A1, A2 and A3 are provided for the respective bank groups of the ROM 100*i* of the ninth example shown in FIGS. 12A and 12B, in which each bank group includes four banks corresponding to five sub-bit lines 31 to 35. The remaining configuration of the ROM 100*m* of the twelfth example is the same as that of the ROM 100*i* of the ninth example.

In the ROM 100m of the twelfth example having such a configuration, the effects of the ninth example can also be attained. In addition, the electrical isolation among the bank groups and the elimination of an interference (e.g., a leakage current) from other bank groups are realized. As a result, it is possible to read out the information from the memory cells more stably.

In the foregoing examples, a ROM using a bank system is assumed to be a ROM of an NOR type. Alternatively, a ROM of an NAND type can also be used as the ROM using a bank system. It is to be appreciated that the present invention is applicable to a ROM of an NAND type.

As is apparent from the foregoing description, according to the present invention, it is possible to suppress the variation in the bit line potential depending upon the position of a memory cell in a bank, so that a readout margin can be increased. As a result, it is also possible to increase the number of memory cells included in one bank, so that a memory cell array can be integrated more highly.

Since a multivalent ROM is supposed to read a subtle current, the variation in the bit line potential has prevented a conventional multivalent ROM from reading a subtle current or caused an error in reading such a current. However, according to the present invention, the bit line potential can be read out precisely and stably even in a multivalent ROM.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor storage device comprising:
    a memory cell array formed by arranging a plurality of memory cells in matrix, each of the plurality of memory cells being formed of a memory transistor;
    a plurality of bit lines which are provided so as to correspond to respective columns of the memory cells for reading out information from the memory cells;
    a plurality of word lines which are provided so as to correspond to respective rows of the memory cells, each of the word lines being connected to gates of the memory transistors forming the memory cells;
    a controller for generating a predetermined control signal in accordance with a position of a selected word line in the memory cell array; and
    a load circuit which is connected to at least one of the plurality of bit lines via a selection transistor and is configured such that load characteristics thereof are variable in accordance with the control signal.

2. A semiconductor storage device according to claim 1, wherein each of the memory cells is configured so as to retain information corresponding to three or more potential levels forming a multivalent ROM.

3. A semiconductor storage device according to claim 1, wherein a plurality of memory cell arrays are provided on a semiconductor substrate, each of the memory cell arrays comprising a plurality of memory cells which are connected to one of the main bit lines and one of the main ground lines, and an isolation region for electrically isolating adjacent ones of the plurality of memory cell arrays are formed by a plurality of isolating memory cells provided in a column direction, a threshold value of each of the isolating memory cells being set such that the memory transistor of the memory cell is always in a non-conductive state irrespective of whether the memory cell is in a selected state or in a non-selected state.

4. A semiconductor storage device according to claim 3, wherein the threshold value of each of the isolating memory cells is set by implanting ions into a region of the memory transistor forming the memory cell.

5. A semiconductor storage device according to claim 4, wherein each of the memory cells has any of at least two threshold values, and one of these threshold values of the memory cells is set such that the memory transistor of the memory cell is always in a non-conductive state irrespective of whether the memory cell is in a selected state or in a non-selected state, and the threshold value of the memory cells is equal to the threshold value of the isolating memory cells.

6. A semiconductor storage device comprising:
    a memory cell array formed by arranging a plurality of memory cells in matrix, each of the plurality of memory cells being formed of a memory transistor;
    a sub-bit line and a sub-ground line which are alternately arranged such that either the sub-bit line or the sub-ground line corresponds to each column of the memory cells;
    a data line for outputting data of the memory cells;
    a load circuit which is connected to the data line and is configured such that load characteristics thereof are variable in accordance with a predetermined control signal;
    a main bit line connected to the data line via a column selection transistor;
    a main ground line connected to a ground line via another column selection transistor;
    a first bank selection transistor, which is disposed on one side of the column of the memory cells in the memory cell array and is connected between the main bit line and the sub-bit line;
    a second bank selection transistor, which is disposed on the other side of the column of the memory cells in the memory cell array and is connected between the main ground line and the sub-ground line; and
    a plurality of word lines which are provided so as to correspond to respective rows of the memory cells and divided in a direction along the columns of the memory cells such that a plurality of word line groups are formed, each of the word lines being connected to gates of the memory transistors forming the memory cells,
    wherein, when one of the plurality of word lines is selected, the load characteristics of the load circuit are switched depending upon the control signal corresponding to the word line group to which the selected word line belongs.

7. A semiconductor storage device according to claim 6, wherein one or two of the sub-bit lines are connected to the main bit line via the first bank selection transistor,
    and at least two of the sub-ground lines are connected to the main ground line via the second bank selection transistor,
    and wherein, when one of the first bank selection transistors and one of the second bank selection transistors are selected, the main bit line and the sub-bit line adjacent thereto are electrically connected with each other, and the main ground line and the sub-ground line adjacent thereto are electrically connected with each other.

8. A semiconductor storage device according to claim 6, wherein each of the memory cells is configured so as to retain information corresponding to three or more potential levels forming a multivalent ROM.

9. A semiconductor storage device according to claim 6, wherein a plurality of memory cell arrays are provided on a semiconductor substrate, each of the memory cell arrays comprising a plurality of memory cells which are connected to one of the main bit lines and one of the main ground lines, and an isolation region for electrically isolating adjacent ones of the plurality of memory cell arrays are formed by a plurality of isolating memory cells provided in a column direction, a threshold value of each of the isolating memory cells being set such that the memory transistor of the memory cell is always in a non-conductive state irrespective of whether the memory cell is in a selected state or in a non-selected state.

10. A semiconductor storage device according to claim 9, wherein the threshold value of each of the isolating memory cells is set by implanting ions into a region of the memory transistor forming the memory cell.

11. A semiconductor storage device according to claim 10, wherein each of the memory cells has any of at least two threshold values, and one of these threshold values of the memory cells is set such that the memory transistor of the memory cell is always in a non-conductive state irrespective of whether the memory cell is in a selected state or in a non-selected state, and the threshold value of the memory cells is equal to the threshold value of the isolating memory cells.

12. A semiconductor storage device comprising:
a memory cell array formed by arranging a plurality of memory cells in matrix, each of the plurality of memory cells being formed of a memory transistor;
a first sub-bit line, a second sub-bit line, a third sub-bit line and a fourth sub-bit line, which are repeatedly arranged in a predetermined order such that any one of the sub-bit lines corresponds to each column of the memory cells;
a data line for outputting data of the memory cells;
a load circuit which is connected to the data line and is configured such that load characteristics thereof are variable in accordance with a predetermined control signal;
a main bit line connected to the data line via a column selection transistor;
a main ground line connected to a ground line via another column selection transistor; and
a plurality of word lines which are provided so as to correspond to respective rows of the memory cells and divided in a direction along the columns of the memory cells such that a plurality of word line groups are formed, each of the word lines being connected to gates of the memory transistors forming the memory cells,
wherein the first sub-bit line is connected to the main ground line via a first bank selection transistor on one side of the memory cell array and is connected to the main bit line via a second bank selection transistor on the other side of the memory cell array,
the second sub-bit line is connected to the main ground line via the first and second bank selection transistors, respectively, on both sides of the memory cell array,
the third sub-bit line is connected to the main bit line via the first bank selection transistor on one side of the memory cell array and is connected to the main ground line via the second bank selection transistor on the other side of the memory cell array, and the fourth sub-bit line is connected to the main bit line via the first and second bank selection transistors, respectively, on both sides of the memory cell array,
and when one of the plurality of word lines is selected, the load characteristics of the load circuit are switched depending upon a control signal corresponding to a word line group to which the selected word line belongs.

13. A semiconductor storage device according to claim 12, wherein each of the memory cells is configured so as to retain information corresponding to three or more potential levels forming a multivalent ROM.

14. A semiconductor storage device according to claim 12, wherein a plurality of memory cell arrays are provided on a semiconductor substrate, each of the memory cell arrays comprising a plurality of memory cells which are connected to one of the main bit lines and one of the main ground lines, and an isolation region for electrically isolating adjacent ones of the plurality of memory cell arrays are formed by a plurality of isolating memory cells provided in a column direction, a threshold value of each of the isolating memory cells being set such that the memory transistor of the memory cell is always in a non-conductive state irrespective of whether the memory cell is in a selected state or in a non-selected state.

15. A semiconductor storage device according to claim 14, wherein the threshold value of each of the isolating memory cells is set by implanting ions into a region of the memory transistor forming the memory cell.

16. A semiconductor storage device according to claim 15, wherein each of the memory cells has any of at least two threshold values, and one of these threshold values of the memory cells is set such that the memory transistor of the memory cell is always in a non-conductive state irrespective of whether the memory cell is in a selected state or in a non-selected state, and the threshold value of the memory cells is equal to the threshold value of the isolating memory cells.

17. A semiconductor storage device comprising:
a memory cell array formed by arranging a plurality of memory cells in matrix, each of the plurality of memory cells being formed of a memory transistor;
a plurality of sub-bit lines which are provided so as to correspond to respective columns of the memory cells;
a data line for outputting data of the memory cells;
a first main bit line and a second main bit line which are connected to the data line via a first column selection transistor and to a ground line via a second column selection transistor;
a first bank selection transistor connected to the first main bit line and one of two adjacent sub-bit lines;
a second bank selection transistor connected to the second main bit line and the other of the two adjacent sub-bit lines;
a plurality of word lines which are provided so as to correspond to respective rows of the memory cells, each of the word lines being connected to gates of the memory transistors forming the memory cells;
a controller for generating a predetermined control signal in accordance with a position of a selected word line in the memory cell array,
wherein a first state, where the first main bit line is electrically connected to the data line and the second main bit line is electrically connected to the ground line, and a second state, where the first main bit line is electrically connected to the ground line and the second main bit line is electrically connected to the data line, are selected in accordance with the control signal.

18. A semiconductor storage device according to claim 17, wherein each of the memory cells is configured so as to retain information corresponding to three or more potential levels forming a multivalent ROM.

19. A semiconductor storage device according to claim 17, wherein a plurality of memory cell arrays are provided on a semiconductor substrate, each of the memory cell arrays comprising a plurality of memory cells which are connected to one of the main bit lines and one of the main ground lines, and an isolation region for electrically isolating adjacent ones of the plurality of memory cell arrays are formed by a plurality of isolating memory cells provided in a column direction, a threshold value of each of the isolating memory cells being set such that the memory transistor of the memory cell is always in a non-conductive state irrespective of whether the memory cell is in a selected state or in a non-selected state.

20. A semiconductor storage device according to claim 19, wherein the threshold value of each of the isolating memory cells is set by implanting ions into a region of the memory transistor forming the memory cell.

21. A semiconductor storage device according to claim 20, wherein each of the memory cells has any of at least two threshold values, and one of these threshold values of the memory cells is set such that the memory transistor of the memory cell is always in a non-conductive state irrespective of whether the memory cell is in a selected state or in a non-selected state, and the threshold value of the memory cells is equal to the threshold value of the isolating memory cells.

22. A semiconductor storage device comprising:
a memory cell array formed by arranging a plurality of memory cells in matrix, each of the plurality of memory cells being formed of a memory transistor;
a first sub-bit line and a second sub-bit line which are alternately provided such that either one of the first sub-bit line and the second sub-bit line corresponds to each column of the memory cells;
a data line for outputting data of the memory cells;
a first main bit line which is connected to the data line via a first column selection transistor and to a ground line via a second column selection transistor;
a second main bit line which is connected to the data line via a third column selection transistor and to the ground line via a fourth column selection transistor;
a first bank selection transistor which is disposed on one side of the column of the memory cells in the memory cell array and is connected between the first main bit line and the first sub-bit line;
a second bank selection transistor which is disposed on the other side of the column of the memory cells in the memory cell array and is connected between the second main bit line and the second sub-bit line; and
a plurality of word lines which are provided so as to correspond to respective rows of the memory cells and divided into a first word line group which are located on a side of the first bank selection transistor and a second word line group which are located on a side of the second bank selection transistor, each of the word lines being connected to gates of the memory transistors forming the memory cells,
wherein, when one of the word lines belonging to the first word line group is selected, the second and third column selection transistors are selected, so that the first main bit line is electrically connected to the ground line and the second main bit line is electrically connected to the data line, and when one of the word lines belonging to the second word line group is selected, the first and the fourth column selection transistors are selected, so that the second main bit line is electrically connected to the ground line and the first main bit line is electrically connected to the data line.

23. A semiconductor storage device according to claim 22, wherein each of the first word line group and the second word line group is divided into two or more word line sub-groups, and a load circuit is provided which is connected to the data line and configured such that load characteristics thereof are variable in accordance with a predetermined control signal, and when one of the word lines is selected, the load characteristics of the load circuit are switched in accordance with a control signal corresponding to the word line sub-group, to which the selected word line belongs.

24. A semiconductor storage device according to claim 22 wherein each of the memory cells is configured so as to retain information corresponding to three or more potential levels forming a multivalent ROM.

25. A semiconductor storage device according to claim 22, wherein a plurality of memory cell arrays are provided on a semiconductor substrate, each of the memory cell arrays comprising a plurality of memory cells which are connected to one of the main bit lines and one of the main ground lines, and an isolation region for electrically isolating adjacent ones of the plurality of memory cell arrays are formed by a plurality of isolating memory cells provided in a column direction, a threshold value each of the isolating memory cells being set such that the memory transistor of the memory cell is always in a non-conductive state irrespective of whether the memory cell is in a selected state or in a non-selected state.

26. A semiconductor storage device according to claim 25, wherein the threshold value of each of the isolating memory cells is set by implanting ions into a region of the memory transistor forming the memory cell.

27. A semiconductor storage device according to claim 26, wherein each of the memory cells has any of at least two threshold values, and one of these threshold values of the memory cells is set such that the memory transistor of the memory cell is always in a non-conductive state irrespective of whether the memory cell is in a selected state or in a non-selected state, and the threshold value of the memory cells is equal to the threshold value of the isolating memory cells.

* * * * *